(12) United States Patent
Itose et al.

(10) Patent No.: US 8,999,208 B2
(45) Date of Patent: Apr. 7, 2015

(54) IN-GA-SN OXIDE SINTER, TARGET, OXIDE SEMICONDUCTOR FILM, AND SEMICONDUCTOR ELEMENT

(75) Inventors: Masayuki Itose, Sodegaura (JP); Mami Nishimura, Sodegaura (JP); Masashi Kasami, Sodegaura (JP); Koki Yano, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 260 days.

(21) Appl. No.: 13/580,355

(22) PCT Filed: Feb. 22, 2011

(86) PCT No.: PCT/JP2011/000972
§ 371 (c)(1),
(2), (4) Date: Aug. 21, 2012

(87) PCT Pub. No.: WO2011/105047
PCT Pub. Date: Sep. 1, 2011

(65) Prior Publication Data
US 2012/0313057 A1 Dec. 13, 2012

(30) Foreign Application Priority Data
Feb. 24, 2010 (JP) ................................. 2010-038979

(51) Int. Cl.
*H01B 1/02* (2006.01)
*C04B 35/01* (2006.01)
(Continued)

(52) U.S. Cl.
CPC ............... *C04B 35/01* (2013.01); *C04B 35/457* (2013.01); *C04B 35/62655* (2013.01); *C04B 37/026* (2013.01); *C04B 2235/3284* (2013.01); *C04B 2235/3286* (2013.01); *C04B 2235/5409* (2013.01); *C04B 2235/604* (2013.01); *C04B 2235/656* (2013.01); *C04B 2235/6562* (2013.01); *C04B 2235/6565* (2013.01); *C04B 2235/6567* (2013.01); *C04B 2235/658* (2013.01); *C04B 2235/76* (2013.01); *C04B 2235/77* (2013.01);
(Continued)

(58) Field of Classification Search
USPC ............ 252/518.1, 520.1; 204/192.1, 298.01, 204/298.13; 257/59, 43
See application file for complete search history.

(56) References Cited

U.S. PATENT DOCUMENTS 5,407,602 A 4/1995 Cava
2010/0289020 A1 11/2010 Yano et al.
(Continued)

FOREIGN PATENT DOCUMENTS

JP 04-272612 9/1992
JP 07-094015 4/1995
(Continued)

OTHER PUBLICATIONS

International Preliminary Report on Patentability PCT/JP2011/000972 dated Sep. 27, 2012.
(Continued)

*Primary Examiner* — Khanh Tuan Nguyen
(74) *Attorney, Agent, or Firm* — Foley & Lardner LLP

(57) ABSTRACT

An oxide sintered body including indium element (In), gallium element (Ga) and tin element (Sn) in atomic ratios represented by the following formulas (1) to (3):

$$0.10 \leq In/(In+Ga+Sn) \leq 0.60 \quad (1)$$

$$0.10 \leq Ga/(In+Ga+Sn) \leq 0.55 \quad (2)$$

$$0.0001 < Sn/(In+Ga+Sn) \leq 0.60 \quad (3).$$

10 Claims, 8 Drawing Sheets

(51) Int. Cl.

| | | |
|---|---|---|
| *C04B 35/457* | (2006.01) | |
| *C04B 35/626* | (2006.01) | |
| *C04B 37/02* | (2006.01) | |
| *C23C 14/08* | (2006.01) | |
| *C23C 14/34* | (2006.01) | |
| *H01L 29/786* | (2006.01) | |
| *H01L 29/66* | (2006.01) | |
| *H01L 21/02* | (2006.01) | |

(52) U.S. Cl.
CPC ......... *C04B 2235/95* (2013.01); *C04B 2237/02* (2013.01); *C04B 2237/10* (2013.01); *C04B 2237/34* (2013.01); *C04B 2237/407* (2013.01); *C23C 14/086* (2013.01); *C23C 14/3414* (2013.01); *H01L 21/02422* (2013.01); *H01L 21/02488* (2013.01); *H01L 21/02565* (2013.01); *H01L 21/02631* (2013.01); *H01L 29/78693* (2013.01); *C04B 35/6261* (2013.01); *C04B 35/62675* (2013.01); *C04B 35/62695* (2013.01); *C04B 2235/3293* (2013.01); *C04B 2235/6585* (2013.01); *H01L 29/66969* (2013.01)

(56) References Cited

U.S. PATENT DOCUMENTS

| | | | |
|---|---|---|---|
| 2011/0084280 A1* | 4/2011 | Nakayama et al. | 257/59 |
| 2011/0177696 A1 | 7/2011 | Yano et al. | |
| 2011/0260118 A1 | 10/2011 | Yano et al. | |
| 2013/0313549 A1 | 11/2013 | Yano et al. | |

FOREIGN PATENT DOCUMENTS

| | | | | |
|---|---|---|---|---|
| JP | 07-182924 A | 7/1995 | | |
| JP | 2000-077358 | 3/2000 | | |
| JP | 2000-129432 | 5/2000 | | |
| JP | 2006-114928 | 4/2006 | | |
| JP | 2007-123661 A | 5/2007 | | |
| JP | 2008-110915 | * | 5/2008 | ............ C01G 15/00 |
| JP | 2008-280216 A | 11/2008 | | |
| JP | 2010-118407 | 5/2010 | | |
| WO | WO 2008/139654 A1 | 11/2008 | | |
| WO | WO 2009/075281 A1 | 6/2009 | | |
| WO | WO 2009/128424 A1 | 10/2009 | | |
| WO | WO-2009/142289 | 11/2009 | | |
| WO | WO 2010/018707 A1 | 2/2010 | | |

OTHER PUBLICATIONS

International Search Report PCT/JP2011/000972 dated Mar. 29, 2011.

D.D. Edwards et al., "A New Transparent Conducting Oxide in the $Ga_2O_3$-$In_2O_3$-$SnO_2$ System", Appl. Phys. Lett. 70, 13, Mar. 31, 1997, pp. 1706-1708.

Office Action in CN Appln No. 201180010725.3 dated Jan. 6, 2014.

Japanese Observation received in Japanese Patent Application No. 2010-038979 dated Jul. 28, 2014.

Julia M Phillips et al., Transparent conducting thin films of GaInO3, Appl. Phys. Lett., vol. 65 (1), Jul. 4, 1994, pp. 115-117.

* cited by examiner

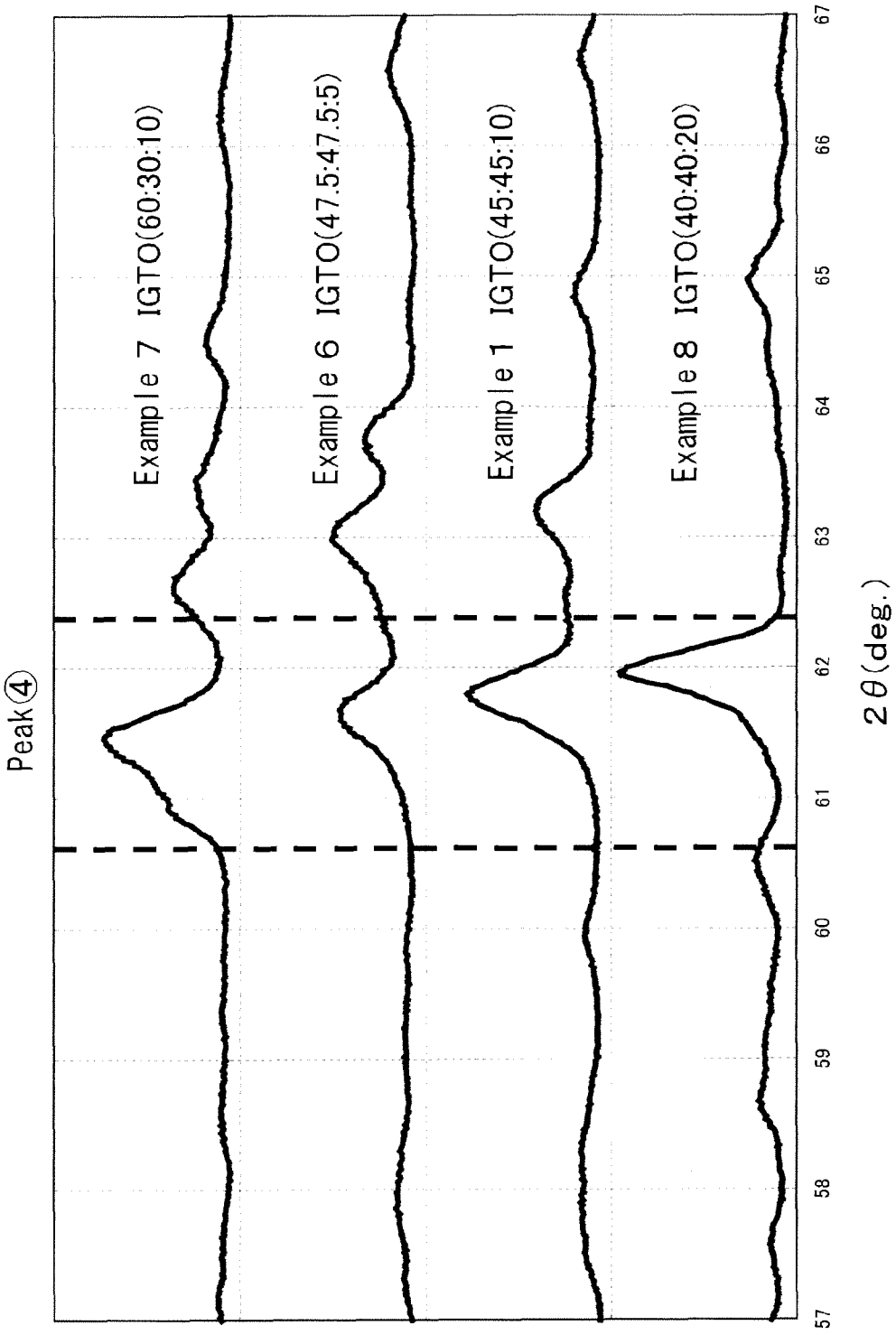

IN-GA-SN OXIDE SINTER, TARGET, OXIDE SEMICONDUCTOR FILM, AND SEMICONDUCTOR ELEMENT

This application is the U.S. National Phase of PCT/JP2011/000972 filed Feb. 22, 2011, which claims priority from Japanese Patent Application No. 2010-038979 filed Feb. 24, 2010. The entirety of each is incorporated herein by reference.

TECHNICAL FIELD

The invention relates to an In—Ga—Sn oxide sintered body, a sputtering target, an oxide semiconductor film and a semiconductor element.

BACKGROUND ART

An amorphous oxide film comprising indium oxide has visible light transmittance, and has a wide range of electric properties ranging from a conductor, a semiconductor to an insulator. Therefore, it has attracted attention as a transparent conductive film or a semiconductor film used in a thin film transistor or the like.

As the method for forming this oxide film, a physical film-forming method such as sputtering, PLD (pulse laser deposition) and deposition or a chemical film-forming method such as the sol-gel method has been studied. A physical film-forming method such as the sputtering method, the PLD method and the electron beam deposition method has been mainly studied since it is a method which can form a film in a large area at relatively low temperatures. When an oxide thin film is formed by a physical film-forming method, in order to form a film uniformly, stably, efficiently and at a high-film forming speed, it is common to use a target formed of an oxide sintered body. In particular, when a target formed of an oxide sintered body is applied to a sputtering method, due to its excellent mass productivity, it can be used for forming a film in a large area such as a flat display.

Regarding oxide sintered bodies, since an n-type semiconductor material containing indium oxide and zinc oxide has been found by Hosokawa, Nakamura or the like, various oxide semiconductors containing indium oxide and zinc oxide, in particular, attracted attention (Patent Document 1). In recent years, a method in which an amorphous oxide semiconductor film prepared by using a target formed of indium oxide, gallium oxide and zinc oxide is driven as a thin film transistor (Patent Document 2) have been studied. However, while an amorphous oxide semiconductor film containing a large amount of zinc oxide has an advantage that it can be etched by an organic acid etching solution (for example, an oxalic acid-based etching solution), it has a problem that it can be dissolved easily in an inorganic acid-based wet etching solution (for example, a mixed acid wet etching solution of phosphoric acid, nitric acid and acetic acid), and hence, wet etching selectivity of Mo (molybdenum), Al (aluminum) or the like is small. Further, an amorphous oxide semiconductor film comprising zinc oxide has a problem that it is etched at a low speed when patterning is conducted by dry etching.

In order to solve these problems, an oxide semiconductor film obtained by adding tin oxide to indium oxide, gallium oxide and zinc oxide and a sputtering target for fabricating the same have been published (Patent Document 3). However, a sputtering target composed of indium oxide, gallium oxide, zinc oxide and tin oxide has many elements to be managed, and hence, the production process or the quality management become complicated.

If a zinc element is contained, when various devices are fabricated on a Si-containing layer such as a silicon substrate, a problem occurs that a zinc element is diffused in the Si-containing layer, whereby the properties are deteriorated. As a result, the applicable device configuration is limited.

An oxide thin film formed of indium oxide, gallium oxide and tin oxide and a target for fabricating the same have been published. However, this is a study aiming at forming a transparent conductive film. Studies on an oxide semiconductor film, in particular, a thin film transistor, have not yet been made. Further, this target contains a large amount of indium, and hence, is not suited to the fabrication of an oxide semiconductor film (Patent Document 3).

In addition, it is disclosed that a compound represented by $Ga_{3-x}In_{5+x}Sn_2O_{16}$ can be synthesized in an area called T phase. However, application of this compound to a target or to the formation of an oxide semiconductor film or the like has not been conducted (Non-Patent Document 1).

In addition, studies have been made on an oxide sintered body target formed of indium oxide, gallium oxide and tin oxide (Patent Documents 4 and 5). However, these studies are intended to fabricate a transparent conductive film. The composition ratio is not adequate to form a semiconductor film, and studies are not made on properties suited to the formation of a semiconductor film.

Further, studies were made on the formation of an InGaSnO$_x$ (4≤x≤5) thin film by using an InGaSnO$_5$ target to allow it to serve as an active layer of a thin film transistor (Patent Document 6). However, studies were not made on appropriate target properties, target production methods, composition ratios suited to the process or the like.

RELATED ART DOCUMENTS

Patent Documents

Patent Document 1: JP-A-2006-114928
Patent Document 2: WO2009/075281
Patent Document 3: WO2008/139654
Patent Document 4: WO2009/128424
Patent Document 5: JP-A-2000-129432
Patent Document 6: JP-A-2007-123661

Non-Patent Document

Non-Patent Document 1 D. D. Edwards et., Al. Appl. Phys. Lett. 70(13), (1997) 1706

SUMMARY OF THE INVENTION

An object of the invention is to provide an oxide semiconductor film which is suited to the patterning process when a semiconductor device is fabricated and an oxide sintered body which is capable of forming the semiconductor film.

As a result of intensive studies, the inventors have found that, using an oxide sintered body target having an composition which comprises tin oxide, but not zinc oxide (composition consisting of indium oxide, gallium oxide and tin oxide), without increasing the number of elements, an oxide semiconductor film which is resistant to an inorganic acid-based wet etching solution (a mixed acid wet etching solution of phosphoric acid/nitric acid/acetic acid) can be produced. Further, the inventors have found that, by using this target, a semiconductor film showing properties equivalent to those of a semiconductor film formed of indium oxide, gallium oxide and zinc oxide can be formed.

Further, the inventors have found that, by selecting the composition ratio of tin oxide, the selectivity ratio at the time of dry etching can be improved.

The inventors have also found conditions for producing an oxide sintered body including a compound having a crystal structure represented by $Ga_{3-x}In_{5+x}Sn_2O_{16}$ (wherein X is 0 to 1). The inventors have found that, due to the presence of a compound having a crystal structure represented by $Ga_{3-x}In_{5+x}Sn_2O_{16}$, an oxide sintered body having properties suited to be used as a target, i.e. having a low resistance and a high density, can be obtained.

According to the invention, the following oxide sintered body or the like are provided.

1. An oxide sintered body comprising indium element (In), gallium element (Ga) and tin element (Sn) in atomic ratios represented by the following formulas (1) to (3):

$$0.10 \leq In/(In+Ga+Sn) \leq 0.60 \quad (1)$$

$$0.10 \leq Ga/(In+Ga+Sn) \leq 0.55 \quad (2)$$

$$0.0001 < Sn/(In+Ga+Sn) \leq 0.60 \quad (3).$$

2. The oxide sintered body according to 1 wherein the atomic ratio of In, Ga and Sn satisfies the following formulas (4) and (5):

$$0.01 \leq Sn/(In+Ga+Sn) \leq 0.30 \quad (4)$$

$$0.30 \leq Ga/(In+Ga+Sn) \leq 0.55 \quad (5).$$

3. The oxide sintered body according to 1, wherein the atomic ratio of In, Ga and Sn satisfies the following formulas (6) and (7):

$$0.30 < Sn/(In+Ga+Sn) \leq 0.60 \quad (6)$$

$$0.10 \leq In/(In+Ga+Sn) < 0.60 \quad (7).$$

4. The oxide sintered body according to any of 1 to 3, wherein the content of zinc element (Zn) is 10000 ppm or less.

5. The oxide sintered body according to any of 1 to 4, which comprises a compound having a crystal structure represented by $Ga_{3-x}In_{5+x}Sn_2O_{16}$ wherein X is 0 to 1.

6. A sputtering target using the oxide sintered body according to any of 1 to 5.

7. A method for producing the sputtering target according to 6 comprising the steps of:
   (a) mixing raw material compound powder to prepare a mixture;
   (b) shaping the mixture to prepare a shaped body having an average thickness of 5.5 mm or more;
   (c) sintering the shaped body at 1280° C. or more and 1520° C. or less for 2 hours or longer and 96 hours or shorter;
   (d) grinding the surface of the sintered body obtained in step (c) by 0.3 mm or more; and
   (e) bonding the sintered body to a backing plate.

8. An oxide semiconductor film comprising indium element (In), gallium element (Ga) and tin element (Sn) in an atomic ratio represented by the following formulas (1) to (3) and having an electron carrier density of $10^{14}$ cm$^{-3}$ or more and $10^{19}$ cm$^{-3}$ or less:

$$0.10 \leq In/(In+Ga+Sn) \leq 0.60 \quad (1)$$

$$0.10 \leq Ga/(In+Ga+Sn) \leq 0.55 \quad (2)$$

$$0.0001 < Sn/(In+Ga+Sn) \leq 0.60 \quad (3).$$

9. A semiconductor device using the oxide semiconductor film according to 8.

In the invention, it is possible to provide an oxide semiconductor film suited to a patterning step when fabricating a semiconductor device and an oxide sintered body target capable of forming the semiconductor film without increasing the number of elements.

BRIEF DESCRIPTION OF THE DRAWINGS

FIG. 8 is an enlarged view of an X-ray chart of an X-ray diffraction chart of the sintered body prepared in Examples 1, 6, 7 and 8 (2θ=57-67°).

MODE FOR CARRYING OUT THE INVENTION

Figure 1:
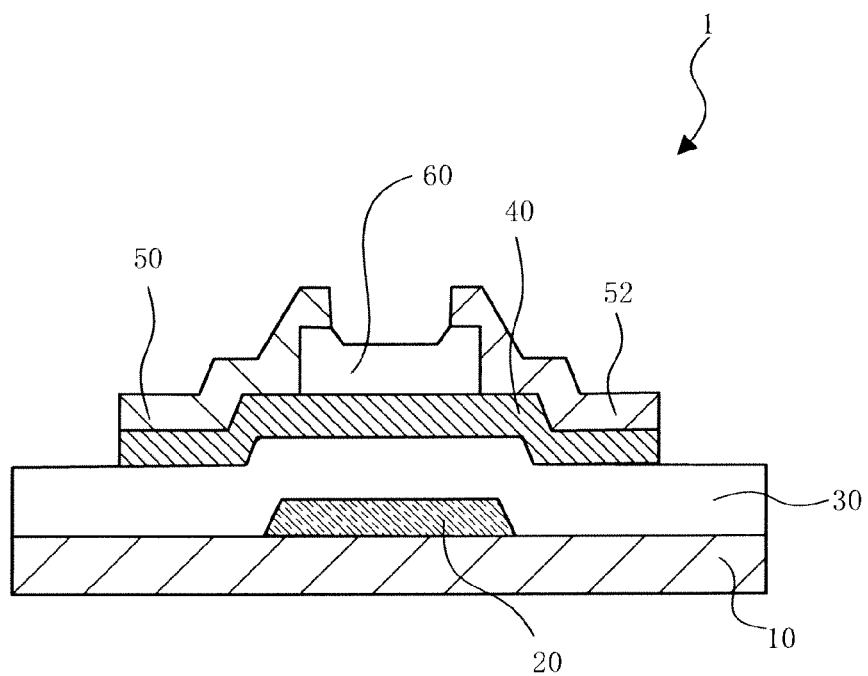
FIG. 1 is a schematic cross-sectional view of a thin film transistor fabricated in Examples.
Figure 2:
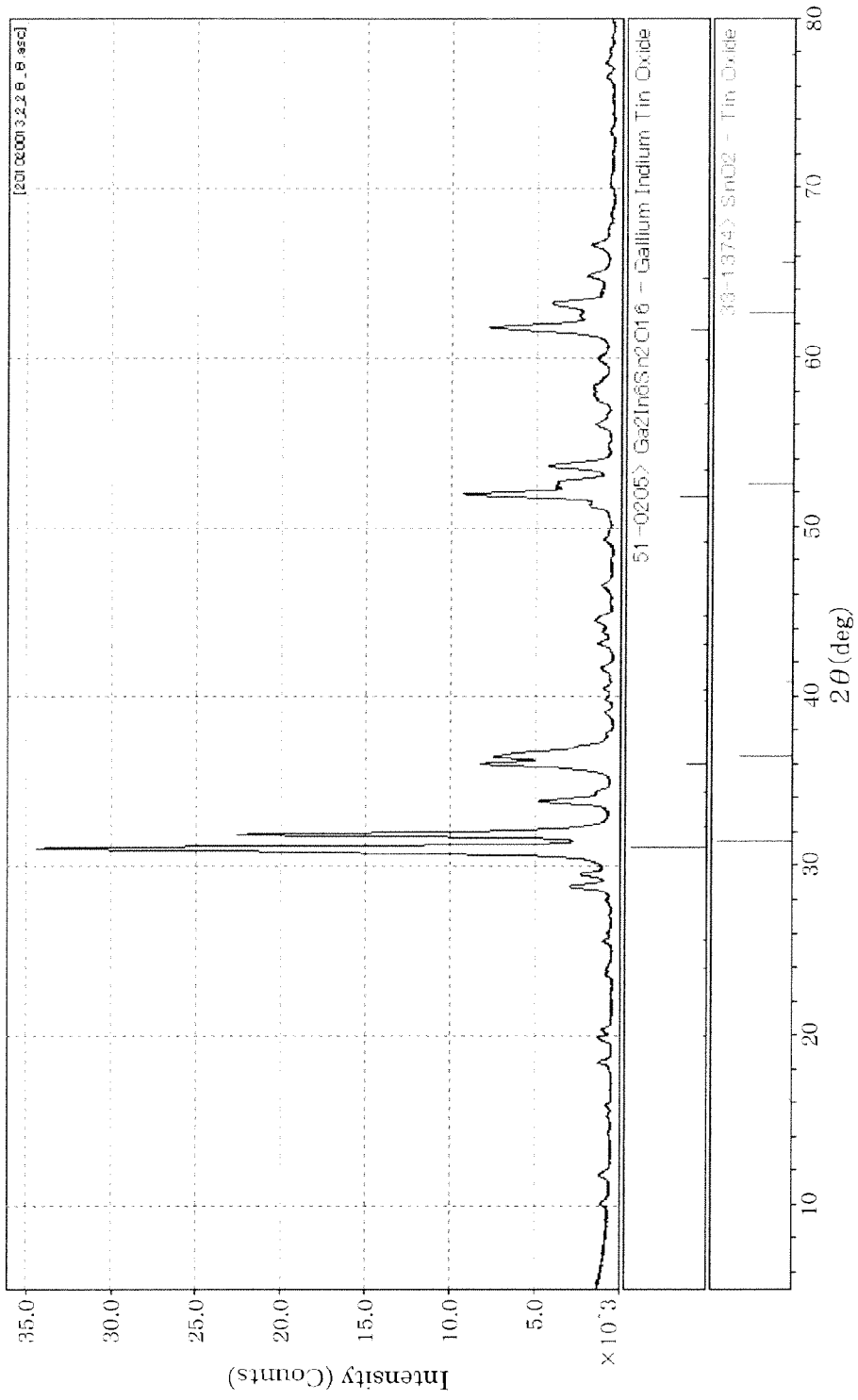
FIG. 2 is an X-ray diffraction chart of an oxide sintered body fabricated in Example 1.
Figure 3:
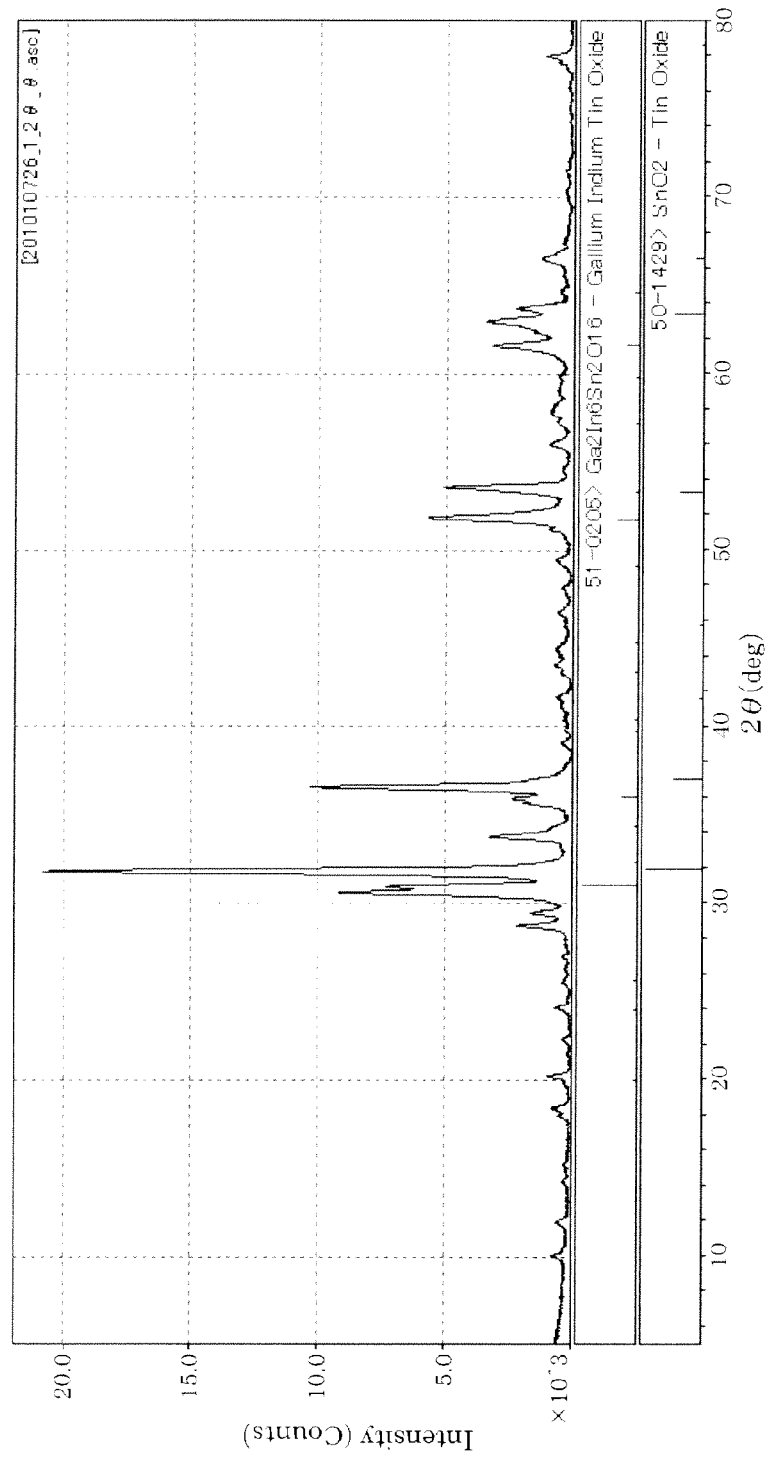
FIG. 3 is an X-ray diffraction chart of an oxide sintered body fabricated in Example 6.
Figure 4:
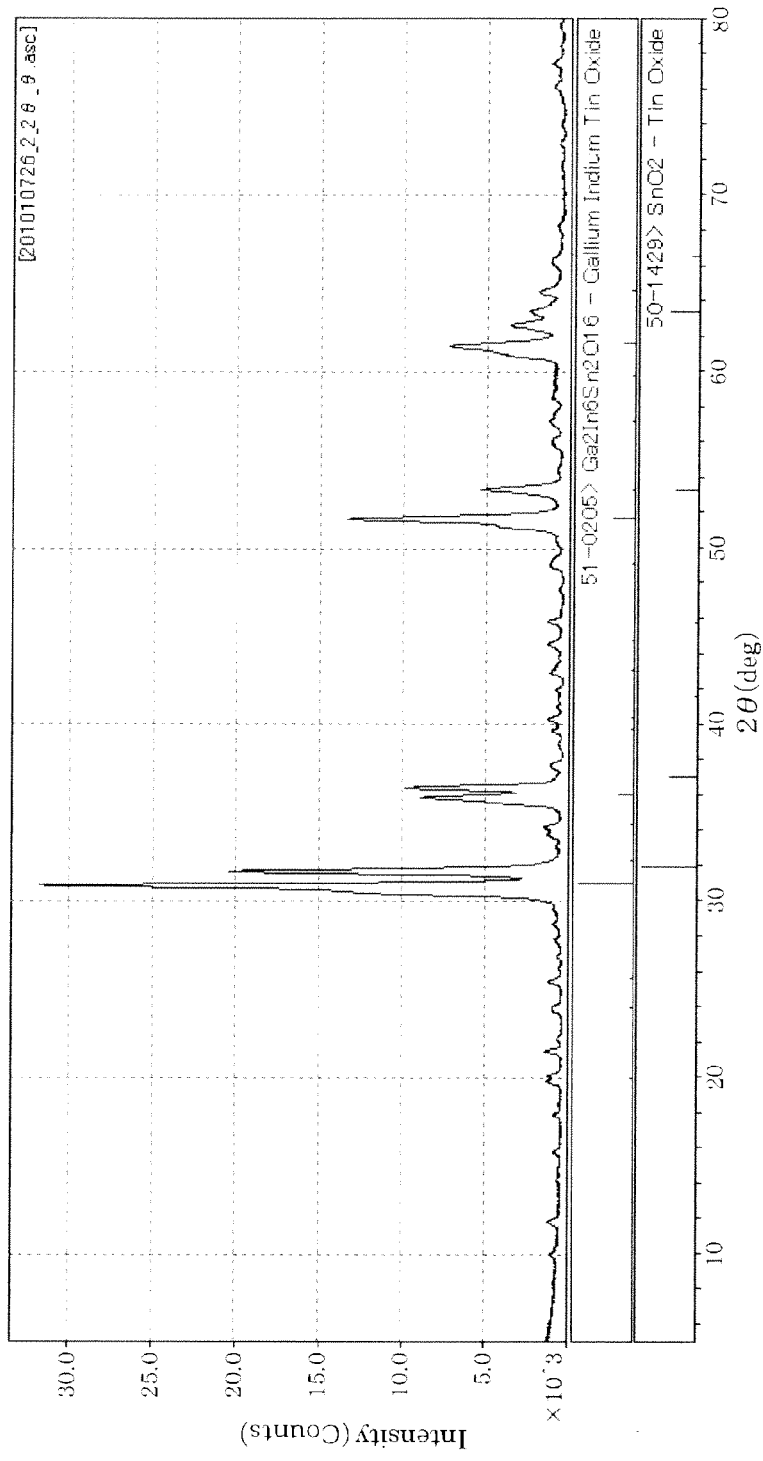
FIG. 4 is an X-ray diffraction chart of an oxide sintered body fabricated in Example 7.
Figure 5:
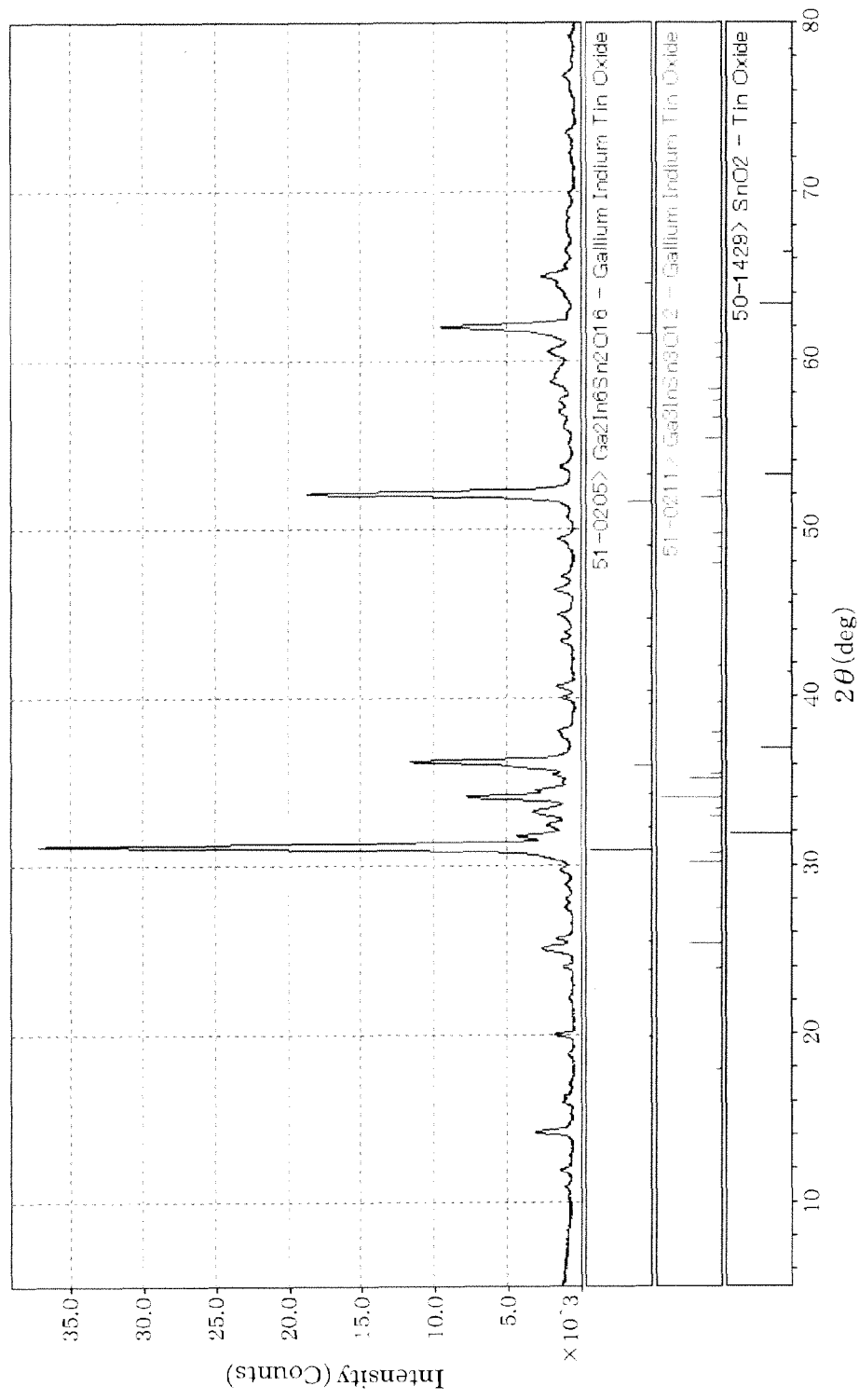
FIG. 5 is an X-ray diffraction chart of an oxide sintered body fabricated in Example 8.

The oxide sintered body of the invention is an oxide sintered body comprising indium element (In), gallium element (Ga) and tin element (Sn), and is characterized that the atomic ratio of each element satisfies the following formulas (1) to (3):

$$0.10 \leq In/(In+Ga+Sn) \leq 0.60 \quad (1)$$

$$0.10 \leq Ga/(In+Ga+Sn) \leq 0.55 \quad (2)$$

$$0.0001 < Sn/(In+Ga+Sn) \leq 0.60 \quad (3).$$

By satisfying the above formulas (1) to (3), it is possible to obtain an oxide sintered body which is capable of forming an oxide semiconductor film which is suited to the patterning process when fabricating a semiconductor device. Further, it is possible to obtain an oxide sintered body having a low resistance and a high relative density or an oxide sintered body having good appearance suffering from only slight unevenness in color.

In the oxide sintered body of the invention, the atomic ratio of Sn and Ga preferably satisfies the following formulas (4) and (5), further preferably the following formulas (8) and (9), and particularly preferably the following formulas (10) and (11):

$$0.01 \leq Sn/(In+Ga+Sn) \leq 0.30 \quad (4)$$

$$0.30 \leq Ga/(In+Ga+Sn) \leq 0.55 \quad (5).$$

$$0.03 \leq Sn/(In+Ga+Sn) \leq 0.15 \quad (8)$$

$$0.30 \leq Ga/(In+Ga+Sn) \leq 0.50 \quad (9)$$

$$0.04 \leq Sn/(In+Ga+Sn) \leq 0.11 \quad (10)$$

$$0.32 \leq Ga/(In+Ga+Sn) \leq 0.48 \quad (11)$$

Within the above-mentioned range, the oxide sintered body can be subjected to wet etching in an organic acid-based etching solution (oxalic acid etching solution, for example), and is hardly dissolved in an inorganic acid-based wet etching solution (a mixed acid wet etching solution of phosphoric acid, nitric acid and acetic acid, for example). The wet etching selectivity thereof for Mo (molybdenum), Al (aluminum) or the like which are used in electrodes is large.

Further, by allowing the Sn/(In+Ga+Sn) to be 30 at. % or less, it is possible to avoid deterioration of transistor performance (lowering of mobility, lowering of on-off ratio) due to the generation of a lower oxide of tin oxide (lowering of average valency of Sn). If the Sn/(In+Ga+Sn) is 15 at. % or less, an increase in mobility or on-off ratio, in particular, can be expected.

In addition, by allowing the Ga/(In+Ga+Sn) to be 30 at. % or more, the transmittance is increased, and photodegradation can be suppressed when a TFT is fabricated.

If the atomic ratio of Sn and Ga satisfies the above-mentioned formulas (4), (5), (8) to (11), it is preferred that the atomic ratio of In be in the range represented by the following formula.

$$0.40 \leq In/(In+Ga+Sn) \leq 0.60$$

In the oxide sintered body of the invention, a case in which the atomic ratio of Sn satisfies the following formulas (6) and (7) is also preferable.

$$0.30 < Sn/(In+Ga+Sn) \leq 0.60 \quad (6)$$

$$0.10 \leq In/(In+Ga+Sn) < 0.60 \quad (7).$$

If the atomic ratio of Sn is within the range represented by the formula (6), dry etching proceeds speedy, whereby the speed of producing a semiconductor layer can be increased when the semiconductor layer is formed by dry etching. Further, the speed of dry etching is increased when the atomic ratio of Sn is large. However, if the atomic ratio of Sn exceeds 0.60, a lower oxide of tin oxide is generated in the oxide semiconductor to deteriorate the properties.

When the atomic ratio of Sn satisfies the above formula (6), it is preferred that the atomic ratio of In and Ga be within the range represented by the following formulas:

$$0.20 \leq In/(In+Ga+Sn) \leq 0.40$$

$$0.20 \leq Ga/(In+Ga+Sn) \leq 0.40$$

In the oxide sintered body of the invention, it is preferred that the content of zinc element (Zn) be 10000 ppm or less. That is, Zn may be contained in an amount which does not impair the advantageous effects of the invention. The content of Zn is more preferably 1000 ppm or less, with 100 ppm or less (does not substantially contain Zn) being particularly preferable. In this invention, "ppm" means "ppm atomic". A small Zn content has an advantage that, diffusion of zinc to an Si substrate or the like does not occur even if a heat treatment or the like is conducted. Further, resistance to inorganic acids is improved, the etching selectivity of Mo or Al for an inorganic acid-based wet etching solution is improved. Further, if sintering is conducted at high temperatures, the surface part suffers from only slight degree of degradation, and as a result, the thickness of the part to be ground can be small (the properties of the surface can be stable when only polishing is conducted without conducting polishing). Further, difference in properties between the surface and the inside (crystal structure, resistance and particle size) becomes small.

In the invention, the metal elements contained in the oxide sintered body may essentially consist of In, Ga and Sn. In the invention, the "essentially" means that the advantageous effects as the target are derived from the composition of metal elements constituting the above-mentioned metal oxide sintered body or that 95 wt % or more and 100 wt % or less (preferably 98 wt % or more and 100 wt % or less, particularly preferably 99.99 wt % or more and 100.00 wt % or less) of metal oxides constituting the metal oxide sintered body are an oxide of the above-mentioned metal elements.

Further, in the invention, the oxide sintered body may contain elements which are inevitably contained during the purification step of a raw material which is normally available or impurities which are inevitably mixed in during the production process. It is preferred that the above-mentioned elements or the above-mentioned impurities be contained in an amount of 10 ppm or less relative to the total amount of constituting elements.

The atomic ratio of the each element contained in the oxide sintered body of the invention can be obtained by quantitatively analyzing the elements contained by Inductively Coupled Plasma Atomic Emission Spectroscopy (ICP-AES).

Specifically, in an analysis using ICP-AES, a sample solution is atomized by means of a nebulizer, and then introduced into argon plasma (about 6000 to 8000° C.). The elements in the sample are excited by absorbing thermal energy, whereby orbit electrons are transferred from the ground state to an orbit with a higher energy level. These orbit electrons are transferred to an orbit with a lower energy level within $10^{-7}$ to $10^{-8}$ seconds. At this time, difference in energy is radiated as light to cause emission. Since this light has a wavelength (spectral line) peculiar to the element, the presence of the element can be confirmed by the presence of the spectral line (qualitative analysis).

Further, since the amplitude of each of the spectral line (emission intensity) increases in proportion to the number of elements contained in a sample, the concentration of a sample solution can be obtained by comparing a sample solution with a standard solution with a known concentration (quantitative analysis).

After identifying the element contained by a qualitative analysis, the content thereof is obtained by a quantitative analysis. From the results, the atomic ratio of each element is obtained.

It is preferred that the oxide sintered body of the invention contain a compound having a crystal structure represented by $Ga_{3-x}In_{5+x}Sn_2O_{16}$ (wherein X is 0 to 1).

As examples of the compound having a crystal structure represented by $Ga_{3-x}In_{5+x}Sn_2O_{16}$, $Ga_2In_6Sn_2O_{16}$, $Ga_{2.4}In_{5.6}Sn_2O_{16}$ or the like can be given. No specific restrictions are imposed as long as it is a compound represented by $Ga_{3-x}In_{5+x}Sn_2O_{16}$.

Whether the compound is a compound having a crystal structure represented by $Ga_{3-x}In_{5+x}Sn_2O_{16}$ is judged by referring to the JCPDS (Joint Committee of Powder Diffraction Standards) card. It is judged to be a compound having a crystal structure represented by $Ga_{3-x}In_{5+x}Sn_2O_{16}$, if it is peak-shifted with a pattern corresponding or similar to $Ga_2In_6Sn_2O_{16}$(JCPDS card: 51-0205) or $Ga_{2.4}In_{5.6}Sn_2O_{16}$ (JCPDS card: 51-0204).

When the oxide sintered body of the invention is analyzed by the X-ray diffraction analysis mentioned later, a peak appears in the range (1) 30.0 to 32.0°, (2) 35.0 to 37.0°, (3) 51.0 to 53.0° and (4) 60.5 to 63.0°. It is preferred that a peak appear in the range (1) 30.5 to 31.5°, (2) 35.5 to 36.5°, (3) 51.5 to 52.5° and (4) 61.0 to 62.5.

In the oxide sintered body of the invention, it is desired that the above-mentioned compound having a crystal structure represented by $Ga_{3-x}In_{5+x}Sn_2O_{16}$ be a primary component or a secondary component. It is particularly desirable that the above-mentioned compound having a crystal structure represented by $Ga_{3-x}In_{5+x}Sn_2O_{16}$ be a primary component. Whether it is a primary component or a secondary component is judged by the height of a peak obtained by the X-ray diffraction analysis mentioned later. Specifically, the main component means a component of which the maximum peak intensity is the largest and the second component means a component of which the maximum peak intensity is the second largest to that of the main component.

The oxide sintered body comprising a compound having a crystal structure represented by $Ga_{3-x}In_{5+x}Sn_2O_{16}$ shows a property that it has a particularly low resistance and a high density when used as a target.

The measurement conditions of the X-ray diffraction are as follows, for example.
Apparatus: Ultima-III, manufactured by Rigaku Corporation
X rays: Cu-Kα rays (wavelength: 1.5406 Å, monochromized by means of a graphite monochrometer)
2θ-θ reflection method, continuous scanning (1.0°/min)
Sampling interval: 0.02°
Slit DS, SS: 2/3°, RS: 0.6 mm If the structure is judged by the crystal structure X-ray diffraction pattern, the amount of oxygen may be excessive or insufficient (oxygen deficiency). That is, the atomic ratio of the oxygen element may be deviated from the chemical stoichiometric ratio. In the invention, it is preferred that the oxygen deficiency be present. If the amount of oxygen in the oxide sintered body is excessive, the resistance may be too high when it is formed into a target.

The oxide sintered body of the invention is suited for use as the sputtering target. Hereinbelow, an explanation is made on the method for producing an oxide sintered body and a sputtering target of the invention.

The sputtering target (oxide sintered body) can be obtained by the production method including the following steps (a) to (e).

(a) mixing raw material compound powder to prepare a mixture;
(b) shaping the mixture to prepare a shaped body having an average thickness of 5.5 mm or more;
(c) sintering the shaped body at 1280° C. or more and 1520° C. or less for 2 hours or longer and 96 hours or shorter;
(d) grinding the surface of the sintered body by 0.3 mm or more; and
(e) bonding the sintered body to a backing plate.

(1) Step (a): Mixing Step

Mixing of raw materials is an essential step of mixing metal oxides as the raw material of the sputtering target of the invention.

As the raw material, powder of an indium compound, powder of a gallium compound, powder of a tin compound or the like is used. As the compound of indium, indium oxide, indium hydroxide or the like can be given, for example. As the compound of tin and gallium, an oxide or a hydroxide thereof can be given, for example. As for the compound of each element, an oxide is preferable since sintering can be conducted easily and bi-products are hardly remained.

As for the purity of the raw material, the purity is normally 2N (99 mass %) or more, preferably 3N (99.9 mass %) or more, with 4N (99.99 mass %) or more being particularly preferable. If the purity is lower than 2N, the durability may be lowered, or burn-in may occur due to entering of impurities to the liquid crystal.

It is preferred that raw materials such as metal oxides used for the production of a target be mixed and be uniformly mixed and pulverized by means of a common pulverizer, e.g. a wet ball mill, a wet bead mill or an ultrasonic apparatus.

In the invention, a pre-firing step may be provided before shaping of the raw material. The pre-firing step is a step which is optionally provided according to need. In the pre-firing step, after obtaining the mixture of compounds as raw material for the sputtering target, the mixture is pre-fired.

By the pre-firing step, although the density of the sintered body can be easily increased, the production cost may also be increased. Therefore, it is more preferred that the density be increased without conducting pre-firing.

In the pre-firing step, it is preferred that the raw material mixture be heat-treated at 500 to 1200° C. for 1 to 100 hours. If a heat treatment is conducted at less than 500° C. or for shorter than 1 hour, thermal decomposition of an indium compound, a gallium compound or a tin compound may be insufficient. If the heat treatment is conducted at a temperature higher than 1200° C. or for exceeding 100 hours, coarsening of particles may occur.

Therefore, it is particularly preferred that a pre-firing be conducted at a temperature range of 800 to 1200° C. for 2 to 50 hours.

It is preferred that a pre-fired product obtained in this step be pulverized before the following shaping and firing steps.

(2) Step (b): Shaping step

A shaping step is an essential step in which the mixture obtained in the above-mentioned mixing step (the pre-fired product, if the above-mentioned pre-firing step is provided) is shaped under pressure, thereby to obtain a shaped product. By this step, the mixture or the pre-fired product is shaped into a shape which is suited for a target. If the pre-firing step is provided, after granulating fine powder of the resulting pre-fired product, the granulated product is press-shaped into a desired shape.

The thickness of the shaped product is preferably 5.5 mm or more, more preferably 6 mm or more, further preferably 8 mm or more, with 12 mm or more being particularly preferable. If the thickness of the shaped body is 5.5 mm or more, temperature gradient or the like in the film thickness direction is decreased, and it is expected that variation in combination of crystal forms at the surface and the deep part hardly occurs.

As the shaping treatment which can be used in this step, press shaping (uniaxial pressing), die shaping, cast molding, injection molding or the like can be mentioned, for example. In order to obtain a sintered body (target) having a high sintered density, it is preferable to conduct shaping by cold isostatic pressing (CIP), or the like.

Further, it is preferable to conduct cold isostatic pressing (CIP), hot isostatic pressing (HIP) or the like, after press molding (uniaxial pressing), i.e. to provide two or more steps of shaping.

When cold isostatic pressing or hydrostatic pressure apparatus is used, it is preferable to hold at a surface pressure of 800 to 4000 kgf/cm² for 0.5 to 60 minutes, more preferable at a surface pressure of 2000 to 3000 kgf/cm² for 2 to 30 minutes. If the surface pressure and the holding time are within the above-mentioned range, it is expected that non-uniformity in composition inside the shaped body can be decreased, whereby uniformity can be obtained. Further, if the surface pressure is less than 800 kgf/cm², the density after sintering may not be increased or the resistance may be increased. If the surface pressure exceeds 4000 kgf/cm², the apparatus may become too large to cause an economical disadvantage. If the holding time is less than 0.5 minute, the density after sintering may not be increased or the resistance may become high. A holding time exceeding 60 minutes may be economically disadvantageous since a too long period of time is taken.

In the shaping, a shaping aid such as polyvinyl alcohol, methyl cellulose, polywax, oleic acid or the like may be used.

(3) Step (c): Sintering Step

A sintering step is an essential step in which a shaped body obtained in the above-mentioned shaping step is fired.

As for the sintering conditions, it is preferred that sintering be conducted in an oxygen gas atmosphere or under an oxygen gas pressure. If sintering is conducted in an atmosphere which does not contain oxygen gas, the density of the resulting target cannot be increased sufficiently, whereby occurrence of abnormal discharge during sputtering may not be fully suppressed.

The heating rate to the sintering temperature is preferably 3° C./min or less, more preferably 2.5° C./min or less, with 1.5° C./min being particularly preferable. If the heating rate exceeds 3° C./min, combination of crystal forms on the surface and in the inside of the sintered body may vary. The reason therefor is that unevenness in temperature or the like occurs in the target thickness direction during the heating.

Heating may be stopped during the heating, and the shaped body may be retained at a prescribed temperature, so that sintering is conducted in two or more stages.

Sintering is conducted at a temperature of preferably 1280° C. or higher and 1520° C. or less, more preferably 1300° C. or higher and 1500° C. or lower, with 1320° C. or higher and 1480° C. or lower being more preferable.

It is preferred that sintering be conducted for 2 hours or longer and 96 hours or shorter, more preferably 4 hours or longer and 48 hours or shorter, with 6 hours or longer and 24 hours or shorter being particularly preferable.

The temperature is lowered during cooling normally at a rate of 4° C./min or less, preferably 2° C./min or less, more preferably 1° C./min or less, further preferably 0.8° C./min or less, and particularly preferably 0.5° C./min or less. If the temperature is lowered at a rate of 4° C./min or less, the crystal form of the invention can be obtained easily. Further, at this cooling rate, cracks hardly occur.

In the invention, a reduction treatment step may be provided in order to decrease the bulk resistance of the sintered body obtained in the above-mentioned sintering step in the entire target. As for the reduction method which can be applied in this step, reduction using a reductive gas, reduction by vacuum firing, reduction with an inert gas or the like can be given.

In the case of a reduction treatment with a reductive gas, hydrogen, methane, carbon monoxide or a mixed gas with these gases and oxygen or the like can be used.

In the case of a reduction treatment by firing in an inert gas, nitrogen, argon, or a mixed gas with these gases and oxygen or the like can be used.

In the invention, it is preferable not to conduct a reduction treatment. If a reduction treatment is conducted, difference in resistance between the surface part and the deep part is generated or increased.

(4) Step (d): Grinding Step

A grinding (processing) step is a step which is provided in order to cut the above-mentioned oxide sintered body obtained in the above-mentioned step into a shape which is suitable for mounting on a sputtering apparatus.

In the invention, the surface of the sintered body obtained in the step (c) mentioned above is ground by 0.3 mm or more. The depth to be ground is preferably 0.5 mm or more, with 2 mm or more being preferable. If grinding is conducted by less than 0.3 mm, the part near the surface in which the crystal structure has been varied may not be removed.

In order to form the oxide sintered body to be a sputtering target, the sintered body is ground by means of a plane grinder, for example, to allow the surface roughness Ra to be 5 μm or less. Further, the sputtering surface of the target may be subjected to mirror finishing, thereby allowing the average surface roughness Ra thereof to be 10001 or less. For this mirror finishing (polishing), known polishing techniques such as mechanical polishing, chemical polishing, mechanochemical polishing (combination of mechanical polishing and chemical polishing) or the like may be used. For example, it can be obtained by polishing by means of a fixed abrasive polisher (polishing liquid: water) to attain a roughness of #2000 or more, or can be obtained by a process in which, after lapping by a free abrasive lap (polisher: SiC paste or the like), lapping is conducted by using diamond paste as a polisher instead of the SiC paste. There are no specific restrictions on these polishing methods.

(5) Step (e): Bonding Step

A bonding step is a step in which the ground sintered body is bonded to a backing plate.

For cleaning of the oxide sintered body after grinding, air blowing, washing with running water or the like can be used. When foreign matters are removed by air blowing, foreign matters can be removed more effectively by air intake by means of a dust collector from the side opposite from the air blow nozzle. Since the above-mentioned air blow or washing with running water has its limit, ultrasonic cleaning or the like can also be conducted. In ultrasonic cleaning, it is effective to conduct multiplex oscillation within a frequency range of 25 to 300 KHz. For example, it is preferable to perform ultrasonic cleaning by subjecting 12 kinds of frequency obtained by dividing the frequency range of 25 to 300 KHz at 25 KHz intervals to multiplex oscillation.

The sputtering target formed of the oxide sintered body of the invention preferably has a relative density of 85% or more, more preferably 92% or more, further preferably 95% or more and particularly preferably 97% or more. If the relative density of the target is 85% or more, when used as a sputtering target, breakage or cracking may hardly occur. In addition, the film-forming speed is increased.

The specific resistance of the target is preferably 700 mΩcm or less, more preferably 100 mΩcm or less, further preferably 50 mΩcm or less, with 20 mΩcm or less being particularly preferable. If the specific resistance is 700 mΩcm or less, it is possible to form a film with a lowered sputtering power. In particular, if the specific resistance is 20 mΩcm or less, cracks may hardly be generated in the target if DC sputtering is conducted.

Within the oxide sintered body, the number of aggregated parts of gallium oxide having a particle size of 2 μm or more is preferably 10/8100 μm$^2$.

By sputtering on an object such as a substrate by using the sputtering target of the invention, a thin film of the oxide semiconductor of the invention can be formed.

The oxide semiconductor film of the invention comprises each of In, Ga and Sn in an atomic ratio represented by the above-mentioned atomic ratios (1) to (3) and has an electron carrier density of $10^{14}$ cm$^{-3}$ or more and $10^{19}$ cm$^{-3}$ or less. The oxide semiconductor film can be formed by the above-mentioned sputtering target of the invention and a known sputtering apparatus.

The electron carrier density is evaluated by means of a Hall measurement apparatus (Resi Test 8310, manufactured by Toyo Corporation, for example).

The average valency of Sn measured by the X-ray photoelectron spectroscopy (XPS) of the oxide semiconductor film obtained is preferably +3.0 or more, more preferably +3.2 or more, particularly preferably +3.6 or more, and further preferably +3.8 or more. Although a higher average valency of Sn is preferable, the upper limit thereof is normally +4.0.

If the average valency of Sn is +3.0 or more, when a TFT is fabricated, TFT properties such as mobility are improved.

In the XPS balance band spectrum, a band derived from Sn5s can be seen only in the spectrum of SnO, which is a lower oxide (electron configuration: Sn+2:4d$^{10}$5s$^2$) and cannot be seen in the spectrum of SnO$_2$ (electron configuration:

Sn+4:4d$^{10}$). Therefore, the average valency of Sn can be obtained from the relative intensity of the Sn5s band (see "X-ray photoelectron spectroscopy, 1998, published by Maruzen Publishing Co., Ltd.). The average valency of Sn of an $SnO_2$ film formed by sputtering is about +2.8.

In order to allow the average valency of Sn to be +3.0 or more, it is preferred that the composition ratio be within the scope of the invention, and the oxygen partial pressure during sputtering be $2\times10^{-3}$ Pa or more. Further, the resulting film may be oxidized by exposure to oxygen plasma or by other methods.

The oxide semiconductor thin film can be preferably used in various semiconductor devices. In particular, it can be preferably used in the semiconductor layer, an oxide thin film layer or the like of a thin film transistor. Of them, the oxide semiconductor film of the invention can be preferably used as a semiconductor layer.

Hereinbelow, as the example of the semiconductor device, an explanation is made on a thin film transistor.

As one example of a thin film transistor, a schematic cross-sectional view of the thin film transistor prepared in the examples of the invention is shown in FIG. 1. This thin film transistor is a channel stopper type (inverse staggered thin film transistor) transistor. In this thin film transistor, a gate electrode 20 is interposed between a substrate 10 and a gate insulating film 30. On the gate insulting film 30, a channel layer (oxide semiconductor) 40 is stacked as an active layer. Further, a source electrode 50 and a drain electrode 52 are respectively provided so as to cover the vicinity of the edge of the semiconductor film 40. An etch stopper layer (protective film) 60 is formed in a part surrounded by the semiconductor film 40, a source electrode 50 and a drain electrode 52.

(1) Substrate

No specific restrictions are imposed on the substrate, and known substrates in this technical field can be used. For example, glass substrates such as alkaline silicate glass, non-alkaline glass and quarts glass; a silicon substrate; resin substrates such as acryl substrates, polycarbonate substrates and polyethylene naphthalate (PEN); and polymer film substrates such as polyethylene terephthalate (PET) and polyamide can be used.

(2) Semiconductor Layer

The semiconductor layer is formed of a composite oxide of In, Sn and Ga. Such a semiconductor layer can be formed by forming a thin film by using the sputtering target of the invention. The semiconductor layer can be formed by the co-sputtering method using two or more targets differing in composition, the PLD method (pulse laser deposition method), the sol-gel method or the like. It is preferable to use the sputtering target of the invention in respect of easiness in industrialization.

In the invention, it is preferred that the semiconductor layer be an amorphous film. Due to the amorphous film, adhesiveness to an insulating film or a protective layer can be improved, whereby uniform transistor properties can be obtained easily even for a large area. Whether the semiconductor layer is amorphous or not can be confirmed by the X-ray crystal structure analysis. If no clear peak is observed, it is an amorphous film. In the meantime, minor crystals may be contained in an amorphous film.

(3) Protective Layer of a Semiconductor Layer

The field effect transistor may have a protective layer of a semiconductor. No specific restrictions are imposed on the material for forming the protective layer. A material which is generally used can be arbitrarily selected as long as the advantageous effects of the invention are not impaired. For example, $SiO_2$, $SiN_X$, $Al_2O_3$, $Ta_2O_5$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, or the like may be used. Among these, it is preferable to use $SiO_2$, $SiN_x$, $Al_2O_3$, $Y_2O_3$, $Hf_2O_3$, or $CaHfO_3$, more preferably $SiO_2$, $SiN_X$, $Y_2O_3$, $Hf_2O_3$, or $CaHfO_3$, with oxides such as $SiO_2$, $Y_2O_3$, $Hf_2O_3$ and $CaHfO_3$ being particularly preferable. The number of oxygen atoms of these oxides does not necessarily coincide with the stoichiometric ratio (e.g., $SiO_2$ or $SiO_x$ may be used). $SiN_X$ may include hydrogen.

The protective layer may have a structure in which two or more different insulating films are stacked.

(4) Gate Insulating Film

No specific restrictions are imposed on the material for forming the gate insulting film. A material which is generally used can be arbitrarily selected as long as the advantageous effects of the invention are not impaired. For example, $SiO_2$, $SiN_X$, $Al_2O_3$, $Ta_2O_6$, $TiO_2$, MgO, $ZrO_2$, $CeO_2$, $K_2O$, $Li_2O$, $Na_2O$, $Rb_2O$, $Sc_2O_3$, $Y_2O_3$, $Hf_2O_3$, $CaHfO_3$, $PbTi_3$, $BaTa_2O_6$, $SrTiO_3$, AlN, or the like may be used. Among these, it is preferable to use $SiO_2$, $SiN_x$, $Al_2O_3$, $Y_2O_3$, $Hf_2O_3$, or $CaHfO_3$, more preferably $SiO_2$, $SiN_x$, $Y_2O_3$, $Hf_2O_3$, or $CaHfO_3$. The number of oxygen atoms of these oxides need not necessarily coincide with the stoichiometric ratio (e.g., $SiO_2$ or $SiO_x$ may be used). $SiN_x$ may include hydrogen.

The gate insulting film may have a structure in which two or more different insulating films are stacked. The gate insulating film may be crystalline, polycrystalline, or amorphous. The gate insulating film is preferably polycrystalline or amorphous from the viewpoint of ease of industrial production.

The gate insulating film may be an organic insulating film such as poly(4-vinylphenol) (PVP) or parylene. The gate insulating film may have a structure in which two or more layers of an inorganic insulating film and an organic insulating film are stacked.

(5) Electrode

No specific restrictions are imposed on the material forming each electrode such as a gate electrode, a source electrode and a drain electrode, and materials which are generally used can be arbitrarily selected as long as the advantageous effects of the invention are not impaired.

For example, transparent electrodes such as indium tin oxide (ITO), indium zinc oxide, ZnO, $SnO_2$ or the like, a metal electrode such as Al, Ag, Cr, Ni, Mo, Au, Ti, Ta and Cu or an alloy metal electrode containing these metals can be used.

Each constituent element (layer) of a thin film transistor can be formed by a method known in this technical field. Specific examples of the film-forming method include a chemical film-forming method such as spraying, dipping and CVD or a physical film-forming method such as sputtering, vapor vacuum deposition, ion plating, or pulsed laser deposition. It is preferable to use a physical film-forming method since the carrier density can be easily controlled, and the quality of the film can be easily improved. It is more preferable to use sputtering due to high productivity.

The formed film can be patterned by various etching methods.

In the invention, it is preferred that the semiconductor layer be formed into a film by DC or AC sputtering by using the target of the invention. As compared with RF sputtering, damage during film-forming can be suppressed by using DC or AC sputtering. Therefore, in the thin film transistor, improvement of mobility or the like can be expected.

In the invention, it is preferred that a heat treatment be conducted at 70 to 350° C. after the semiconductor layer and the protective layer of the semiconductor layer are formed. If the heat treatment temperature is lower than 70° C., heat stability or heat resistance of the resulting transistor may be lowered, the mobility may be lowered, the S value may be increased or the threshold voltage may be increased. If the heat treatment temperature is higher than 350° C., a substrate which does not have heat resistance cannot be used or equipment cost for a heat treatment may be incurred.

It is preferred that a heat treatment be conducted in an inert gas under an oxygen partial pressure of $10^{-3}$ Pa or less or be conducted after the semiconductor layer is covered by the protective layer. Under the above-mentioned conditions, reproducibility is improved.

In the thin film transistor of the invention as mentioned above, it is preferred that the mobility be 3 cm$^2$/Vs or more, more preferably 6 cm$^2$/Vs or more, with 10 cm$^2$/V or more being particularly preferable. If the mobility is 3 cm$^2$/Vs or more, the switching speed may be increased and the transistor is expected to be applied to a large-sized and high-definition display such as 4K$_2$K.

Normally, the on-off ratio is preferably $10^8$ or more, more preferably $10^9$ or more, with $10^{10}$ or more being particularly preferable. If the on-off ratio is high, brightness and darkness of an image become clear, whereby improvement in image quality can be expected.

The off current is normally 50 pA or less, preferably 10 pA or less, more preferably 5 pA or less, with 1 pA or less being particularly preferable. If the off current is 50 pA or less, the amount of leak current is small, and hence, improvement in image quality can be expected when used as a TFT of a display.

The threshold voltage (Vth) is normally –1.0 to 3.0V, preferably –0.5 to 2.0V, more preferably –0.2 to 1.0V, with 0 to 0.5V being particularly preferably.

If the threshold voltage is within the above-mentioned range, the driving voltage may be decreased, whereby power consumption can be decreased.

EXAMPLES

Example 1

(1) Preparation of an Oxide Sintered Body

As a starting material, In$_2$O$_3$ (Purity 4N, BET surface area 15 m$^2$/g), Ga$_2$O$_3$ (Purity 4N, BET surface area 15 m$^2$/g) and SnO$_2$ (Purity 4N, BET surface area 4 m$^2$/g) were used.

These raw materials were weighed such that the atomic ratio of the metal elements became the ratio of the oxide sintered body shown in Table 1, and mixed and pulverized by means of a ball mill.

After mixing and pulverizing, the mixture was dried by natural drying. The resulting mixture power was filled in a mold, and subjected to press molding by a pressing machine to prepare a shaped body having a thickness of 15 mm or more. At this time, the surface pressure was 400 kgf/cm$^2$ and the retaining time was 2 minutes. Thereafter, pressing was conducted by CIP (cold isostatic pressing) under the conditions of a surface pressure of 2000 kgf/cm$^2$ and a holding time of 5 minutes.

The resulting shaped body was sintered in a sintering furnace. Sintering was conducted under the following conditions. After sintering, the sintered body was naturally cooled to room temperature, whereby an oxide sintered body (thickness: 9 mm) was obtained.
Heating rate: 1° C./min
Sintering temperature: 1400° C.
Sintering time: 12 hours
Sintering atmosphere: in the air (2) Preparation of a Sputtering Target After sintering, a sintered body for a sputtering target was cut from the resulting sintered body having a thickness of 9 mm. The upper surface, the lower surface and the corners of the sintered body were cut by means of a diamond cutter, and the surface was ground by means of a surface grinder to obtain a target having a thickness of 5 mm.

The surface was subjected to air blowing, and then ultrasonic cleaning for 3 minutes. Thereafter, the target material was bonded to a backing plate made of oxygen-free copper by means of indium solder, whereby a target was obtained.

For the resulting oxide sintered body (target), the following evaluation was conducted. The results are shown in Table 1.

(A) Composition

The atomic ratio was analyzed by the Inductively Coupled Plasma Atomic Emission Spectroscopy (ICP-AES).

(B) Crystal form

By the X-ray diffraction measurement (XRD), the sintered body and its cut specimen were directly measured under the following conditions:
Apparatus: "Ultima-III" manufactured by Rigaku Corporation
X-rays: Cu-Kα rays (wavelength: 1.5406 Å, monochromatized using a graphite monochrometor)
2θ-θ reflection method, continuous scan (1.0°/min)
Sampling interval: 0.02°
Slit DS, SS: 2/3°, RS: 0.6 mm (C) Specific Resistance Specific resistance was measured by the four probe method (JIS R1637) using a resistivity meter (Loresta, manufactured by Mitsubishi Chemical Corporation). The average value of the resistivity values of ten points is taken as the value of resistivity.

(D) Relative Density (%)

Relative density was measured by the following formula based on the theoretical density calculated from the density of the raw material powder and the density of the sintered body measured by the Archimedian method.

Relative density (%)=(Density measured by the Archimedian method)/(Theoretical density)×100

(E) Appearance (Unevenness in Color)

Under north window light, the sintered body was visually observed from a part which is 50 cm distant from the sintered body, and the evaluation results of the appearance were classified according to the following:
A: Almost not uneven in color
B: Slightly uneven in color
C: Uneven in color If the sintered body suffered from unevenness in color, the judgment of the state during the use of a target, for example, may be difficult.

(3) Preparation and Evaluation of a Thin Film

By magnetron RF sputtering, a 100 nm-thick oxide film was formed under conditions of a total pressure of 0.5 Pa, an oxygen concentration of 5% and an argon concentration of 95%, and the film was then evaluated.

As the organic acid, an oxalic acid-based wet etching solution (ITO-06N, manufactured by Kanto Kagaku, Inc.) was used, and as the inorganic acid, a phosphoric acid-based wet etching solution (which had been adjusted to have the following composition in terms of weight ratio: H$_3$PO$_4$: 73%, HNO$_3$: 3%, CH$_3$COOH: 7%, H$_2$O: 17%) and etching rate and etching resistance at 40° C. were evaluated. Further, the dry etching speed was measured.

The evaluation was conducted according to the following criteria:

Etching rate for the oxalic acid-based wet etching solution
A: Etching rate is 20 nm/min or more
B: Etching rate is 5 nm/min or more and less than 20 nm/min
C: Etching rate is less than 5 nm/min
Resistance to the phosphoric acid-based etching solution
A: Etching rate is 5 nm/min or less
B: Etching rate is faster than 5 nm/min and 20 nm/min or slower
C: Etching rate is faster than 20 nm/min
Dry etching rate
A: Etching rate is 50 Å/min or higher
B: Etching rate is slower than 50 Å/min The average valency of Sn measured by XPS for the resulting thin film was +3.9.

(4) Preparation of a Thin Film Transistor (TFT)

Using the sputtering target obtained in (2) above, a channel stopper type thin film transistor (reverse staggered thin film transistor) shown in FIG. 1 was prepared and evaluated.

As a substrate 10, a glass substrate (Corning 1737) was used. First, on the substrate 10, a 10 nm-thick Mo film, an 80 nm-thick Al film and a 10 nm-thick Mo were sequentially stacked. By using the photolithographic method and the lift-off method, the stacked film was formed into a gate electrode 20.

On the gate electrode 20 and the substrate 10, a 200 nm-thick $SiO_2$ film was formed by the TEOS-CVD method, whereby a gate-insulating layer 30 was formed. The gate insulating layer may be formed by the sputtering method. However, it is preferred that the gate insulating layer be formed by the CVD method such as the TEOS-CVD method or the PECVD method. In the sputtering method, the off current may become high.

Subsequently, by the RF sputtering method, a 50 nm-thick semiconductor film 40 (channel layer) was formed by using the target prepared in (2) above. Thereafter, a heat treatment was conducted in the atmosphere at 300° C. for 60 minutes.

On the semiconductor film 40, as an etch stopper layer 60 (protective film), an $SiO_2$ film was deposited. The protective film may be formed by the CVD method.

In this example, input RF power was 200 W. The atmosphere at the time of film formation was 0.4 Pa (total pressure) and the gas flow ratio at this time was $Ar:O_2$=95:5. The substrate temperature is 50° C. The oxide semiconductor film and the protective film thus stacked were processed into an appropriate size by the photolithographic method and the etching method.

After the formation of the etch stopper layer 60, a 5 nm-thick Mo film, a 50 nm-thick Al film and a 5 nm-thick Mo film were sequentially stacked, and a source electrode 50 and a drain electrode 52 were formed by the photolithographic method and dry etching.

Thereafter, a heat treatment was conducted at 300° C. for 60 minutes in the atmosphere, whereby a transistor with a channel length of 20 μm and a channel width of 20 μm was produced.

Mobility (field effect mobility (μ)), on-off ratio, off current, threshold voltage (Vth) of the thin film transistor were measured. The measurement was conducted by using a semiconductor parameter analyzer (4200, manufactured by Keithley Instruments, Inc.) at room temperature in a light-shielding environment.

Examples 2 to 9 and Comparative Examples 1 to 5

Oxide sintered bodies were produced and evaluated in the same manner as in Example 1, except that the composition ratio and the amount of grinding were changed to those shown in Tables 1 and 3.

The results of the X-ray diffraction measurement (XRD) in Examples 1, 6, 7 and 8 are respectively shown in FIGS. 2 to 5. It could be confirmed that the oxide sintered bodies prepared in Examples 1, 6, 7 and 8 contained a compound having a crystal structure represented by $Ga_{3-x}In_{5+x}Sn_2O_{16}$ wherein X is 0 to 1.

Figure 6:
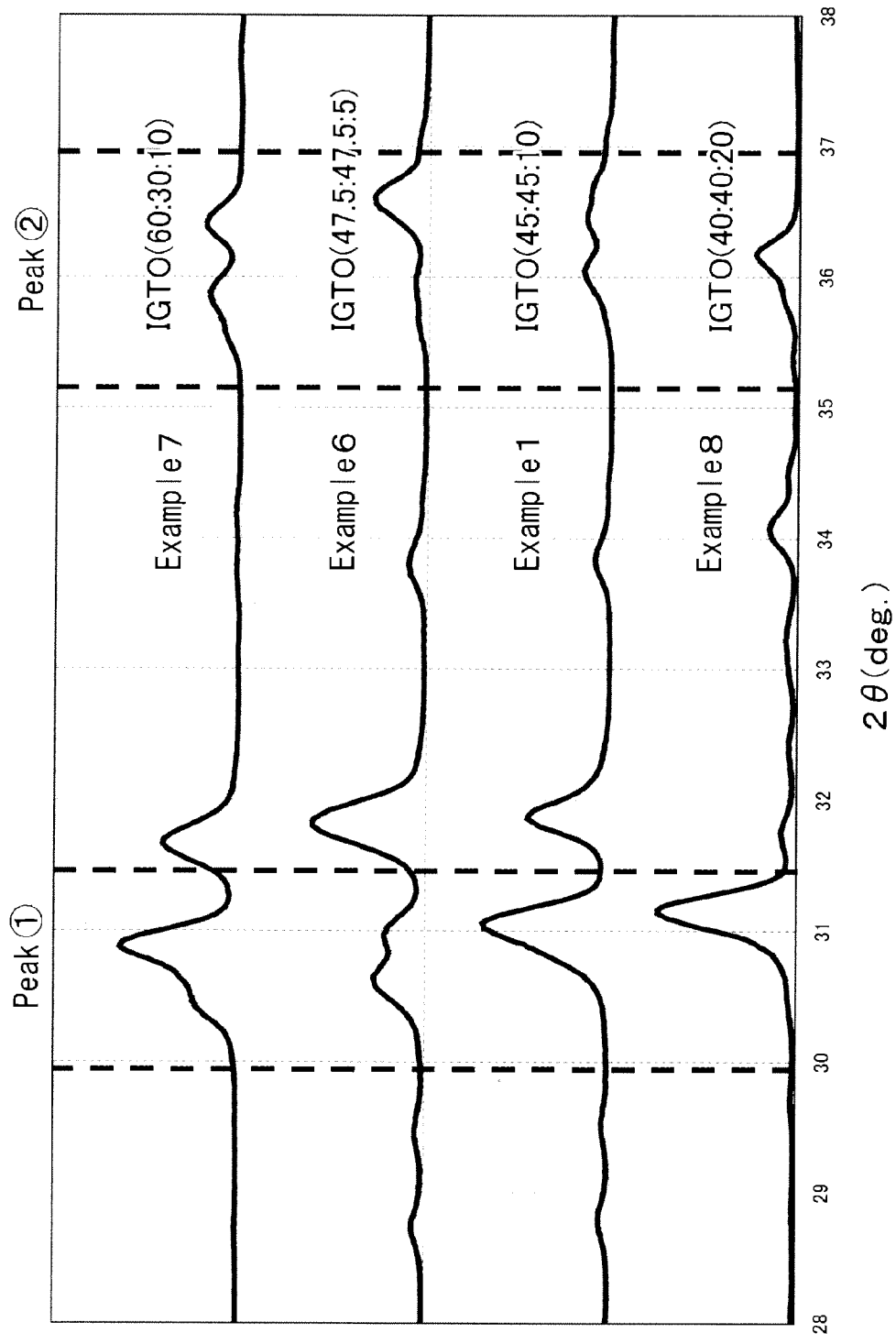
FIG. 6 is an enlarged view of an X-ray diffraction chart of the sintered body prepared in Examples 1, 6, 7 and 8 (2 θ=28-38°)
Figure 7:
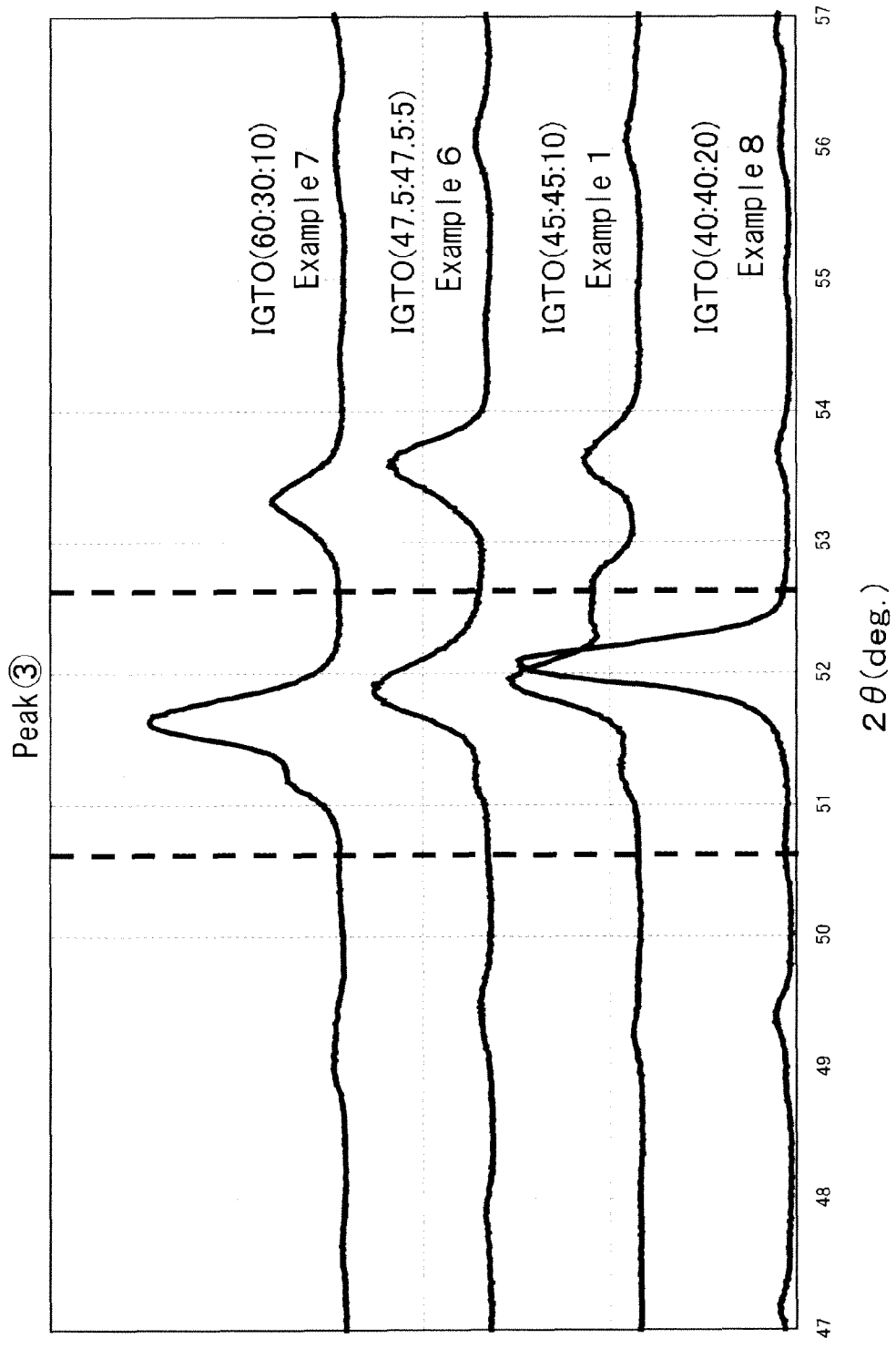
FIG. 7 is an enlarged view of an X-ray diffraction chart of the sintered body prepared in Examples 1, 6, 7 and 8 (2θ=47-57°)

The enlarged views of the X-ray diffraction charts in Examples 1, 6, 7 and 8 (2θ=28-38°, 47-57° and 57-67°) are shown in FIGS. 6 to 8.

Table 4 shows the peak position (angle) obtained from the above-mentioned chart. Further, Table 5 shows the calculated value of the "each angle in Table 4/angle of peak (1) in (①) in FIG. 6)". From the results shown in Table 5, it can be understood that they were crystals having the same pattern and the same structure and differing in lattice spacing.

Examples 10 and 11

As the starting raw material, $In_2O_3$ (purity: 4N, BET specific surface area: 6 m²/g), $Ga_2O_3$ (purity: 4N, BET specific surface area: 6 m²/g) and $SnO_2$ (purity: 4N, BET specific surface area: 6 m²/g) were used.

These raw materials were weighed such that the atomic ratio of the metal elements became ratios shown in Table 2, and mixed by means of a super mixer. These raw materials were packed in an aluminum-made container, and subjected to pre-firing in the atmosphere of air at 950° C. for 5 hours. Subsequently, these raw materials were pulverized by means of an attritor (φ3 mm zirconia beads, agitator rotation speed 300 rpm) for about 0.5 to 5 hours. The slurry after the pulverization was dried by means of a spray dryer at 100 to 150° C. for 5 to 48 hours. The resultant was sieved by means of a sieve having an opening of 250 μm to collect the powder. The pulverization was conducted until the BET specific surface area became 10 m²/g or more.

Subsequently, oxide sintered bodies or the like were produced and evaluated in the same manner as in Example 1, except that the production conditions (whether pre-firing was conducted or not, the mixing method, the granulation method, the sintering atmosphere, the sintering temperature, the sintering time, the amount of grinding or the like) were changed to those shown in Table 2.

Example 12

As the starting raw material, $In_2O_3$ (purity: 4N, median diameter: 1.8 μm), $Ga_2O_3$ (purity: 4N, median diameter: 1.8 μm) and $SnO_2$ (purity: 4N, median diameter: 1.5 μm) were used. These raw materials were weighed such that the atomic ratio of the metal elements became ratios shown in Table 2.

These raw materials were pre-fired in the same manner as in Example 10, and then pulverized until the median diameter of the raw material mixture become 1.0 (pm). Subsequently, oxide sintered bodies or the like were produced and evaluated in the same manner as in Example 10.

Examples 13 to 16

Sputtering targets were produced in the same manner as in Example 1, except that the composition ratio of the oxide sintered body was changed to those shown in Table 2. Further, TFTs were produced and evaluated in the same manner as in Example 1, except that the semiconductor film was formed by dry etching.

Examples 17 to 20

Sputtering targets were produced in the same manner as in Example 10, except that, as the starting material, $In_2O_3$ (purity: 4N, median diameter: 1.8 μm), $Ga_2O_3$ (purity: 4N, median diameter: 1.8 μm) and $SnO_2$ (purity: 4N, median diameter: 1.5 μm) were used and the composition ratio of the oxide sintered body and the sintering temperature were changed to those shown in Table 2.

Further, TFTs were produced and evaluated in the same manner as in Example 1.

In the above-mentioned examples and comparative examples, the number of aggregated parts of gallium oxide having a particle diameter of 2 μm or more was 5/8100 μm² or less in Examples 1 to 18 and 20, 8/8100 μm² in Example 19 and exceeding 10/8100 μm² in Comparative Examples 1 and 2. When sputtering was conducted, the sputtering targets produced in Examples 1 to 20 suffered from only slight degree of abnormal discharge. On the other hand, the sputtering targets produced in Comparative Examples 1 and 2 suffered from frequent occurrence of abnormal discharge.

As for the resulting thin film, the average valency of Sn which was measured by XPS in the same manner as in Example 1 was +3.1 in Example 16 and +2.8 in Comparative Example 1.

TABLE 1

| | | | Examples | | | | |
|---|---|---|---|---|---|---|---|
| | | | 1 | 2 | 3 | 4 | 5 |
| Preparation of sintered body | Pre-firing | | No | No | No | No | No |
| | Mixing method | | Ball mill | Ball mill | Ball mill | Ball mill | Ball mill |
| | Granulation method | | Natural drying | Natural drying | Natural drying | Natural drying | Natural drying |
| | Shaping method | | CIP | CIP | CIP | CIP | CIP |
| | Sintering conditions | Sintering atmosphere | In the air | In the air | In the air | In the air | In the air |
| | | Sintering temperature (° C.) | 1400 | 1400 | 1400 | 1400 | 1400 |
| | | Sintering time (Hr) | 12 | 12 | 12 | 12 | 12 |
| | Composition ratio of sintered body (atomic ratio) | In/(In + Ga + Sn) | 0.45 | 0.50 | 0.50 | 0.55 | 0.55 |
| | | Ga/(In + Ga + Sn) | 0.45 | 0.40 | 0.45 | 0.40 | 0.35 |
| | | Sn/(In + Ga + Sn) | 0.10 | 0.10 | 0.05 | 0.05 | 0.10 |
| | | Zn/(In + Ga + Sn + Zn) | 0.00 | 0.00 | 0.00 | 0.00 | 0.00 |
| | Grinding | Thickness before grinding (mm) | 9.0 | 9.0 | 9.0 | 9.0 | 9.0 |
| | | Thickness after grinding (mm) | 5.0 | 5.0 | 5.0 | 5.0 | 5.0 |
| | | Amount of removed from upper and lower surfaces (mm, each) | 2.0 | 2.0 | 2.0 | 2.0 | 2.0 |
| | Reduction treatment | | No | No | No | No | No |
| Evaluation of sintered body (target) | Crystal form | $Ga_{3-x}In_{5+x}Sn_2O_{16}$ | ① | ① | ① | ① | ① |
| | | Other than above | ② | ② | ② | ② | ② |
| | Specific resistance (mΩcm) | | 28 | 18 | 26 | 14 | 17 |
| | Relative density (%) | | 96 | 97 | 96 | 97 | 97 |
| | Appearance (unevenness in color) | | A | A | A | A | A |
| Evaluation of thin film | Electron carrier density | (cm$^{-3}$) | $4 \times 10^{17}$ | $8 \times 10^{17}$ | $6 \times 10^{17}$ | $1 \times 10^{18}$ | $2 \times 10^{18}$ |
| | Wet etching rate | Organic acid (easiness in dissolution) | A | A | A | A | A |
| | Resistance to inorganic acid | Inorganic acid (hardness in dissolution) | A | A | A | A | A |
| | Dry etching rate | (Easiness being etched) | B | B | B | B | B |
| Evaluation of TFT | Mobility(cm²/Vs) | | 12 | 16 | 14 | 19 | 21 |
| | On-off ratio | | 10⁹ | 10⁹ | 10⁹ | 10⁹ | 10⁹ |
| | Off current(pA) | | 0.5 | 0.5 | 0.5 | 0.5 | 0.5 |
| | Vth(V) | | 0.3 | −0.1 | 0.3 | −0.1 | −0.1 |

| | | | Examples | | | |
|---|---|---|---|---|---|---|
| | | | 6 | 7 | 8 | 9 |
| Preparation of sintered body | Pre-firing | | No | No | NO | No |
| | Mixing method | | Ball mill | Ball mill | Ball mill | Ball mill |
| | Granulation method | | Natural drying | Natural drying | Natural drying | Natural drying |
| | Shaping method | | CIP | CIP | CIP | CIP |
| | Sintering conditions | Sintering atmosphere | In the air | In the air | In the air | In the air |
| | | Sintering temperature (° C.) | 1400 | 1400 | 1400 | 1400 |
| | | Sintering time (Hr) | 12 | 12 | 12 | 12 |
| | Composition ratio of sintered body (atomic ratio) | In/(In + Ga + Sn) | 0.475 | 0.60 | 0.40 | 0.50 |
| | | Ga/(In + Ga + Sn) | 0.475 | 0.30 | 0.40 | 0.40 |
| | | Sn/(In + Ga + Sn) | 0.050 | 0.10 | 0.20 | 0.10 |
| | | Zn/(In + Ga + Sn + Zn) | 0.000 | 0.00 | 0.00 | 0.00 |
| | Grinding | Thickness before grinding (mm) | 9.0 | 9.0 | 9.0 | 5.8 |
| | | Thickness after grinding (mm) | 5.0 | 5.0 | 5.0 | 5.0 |

TABLE 1-continued

| | | | | | | |
|---|---|---|---|---|---|---|
| | | Amount of removed from upper and lower surfaces (mm, each) | 2.0 | 2.0 | 2.0 | 0.4 |
| Evaluation of sintered body (target) | Reduction treatment | | No | No | No | No |
| | Crystal form | $Ga_{3-x}In_{5+x}Sn_2O_{16}$<br>Other than above | ①<br>② | ①<br>② | ①<br>② | ①<br>② |
| | Specific resistance (mΩcm) | | 86 | 14 | 68 | 38 |
| | Relative density (%) | | 95 | 97 | 92 | 96 |
| | Appearance (unevenness in color) | | A | B | B | B |
| Evaluation of thin film | Electron carrier density | $(cm^{-3})$ | $5 \times 10^{17}$ | $5 \times 10^{18}$ | $6 \times 10^{17}$ | $7 \times 10^{17}$ |
| | Wet etching rate | Organic acid (easiness in dissolution) | A | A | A | A |
| | Resistance to inorganic acid | Inorganic acid (hardness in dissolution) | A | A | A | A |
| | Dry etching rate | (Easiness being etched) | B | B | B | B |
| Evaluation of TFT | Mobility (cm²/Vs) | | 12 | 23 | 13 | 14 |
| | On-off ratio | | $10^9$ | $10^9$ | $10^9$ | $10^9$ |
| | Off current (pA) | | 0.5 | 0.5 | 0.5 | 0.5 |
| | Vth (V) | | 0.6 | −1.3 | −0.1 | −0.1 |

* For the crystal form, ① indicates the main component and ② indicates the secondary component.

TABLE 2

| | | | Examples | | | | | |
|---|---|---|---|---|---|---|---|---|
| | | | 10 | 11 | 12 | 13 | 14 | 15 |
| Preparation of sintered body | Pre-firing | | Conducted | Conducted | Conducted | No | No | No |
| | Mixing method | | Beads mill | Beads mill | Beads mill | Ball mill | Ball mill | Ball mill |
| | Granulation method | | Spray dryer | Spray dryer | Spray dryer | Natural drying | Natural drying | Natural drying |
| | Shaping method | | CIP | CIP | CIP | CIP | CIP | CIP |
| | Sintering conditions | Sintering atmosphere | Oxygen inflow | Oxygen inflow | Oxygen inflow | In the air | In the air | In the air |
| | | Sintering temperature (° C.) | 1500 | 1500 | 1500 | 1400 | 1400 | 1400 |
| | | Sintering time (Hr) | 15 | 15 | 15 | 12 | 12 | 12 |
| | Composition ratio of sintered body (atomic ratio) | In/(In + Ga + Sn) | 0.50 | 0.55 | 0.50 | 0.30 | 0.40 | 0.20 |
| | | Ga/(In + Ga + Sn) | 0.40 | 0.40 | 0.40 | 0.30 | 0.20 | 0.40 |
| | | Sn/(In + Ga + Sn) | 0.10 | 0.05 | 0.10 | 0.40 | 0.40 | 0.40 |
| | | Zn/In + Ga + Sn + Zn) | 0.00 | 0.00 | 0.00 | 0.00 | 0.00 | 0.00 |
| | Grinding | Thickness before grinding (mm) | 10.0 | 10.0 | 10.0 | 9.0 | 9.0 | 9.0 |
| | | Thickness after grinding (mm) | 6.0 | 6.0 | 6.0 | 5.0 | 5.0 | 5.0 |
| | | Amount removed from upper and lower surfaces (mm, each) | 2.0 | 2.0 | 2.0 | 2.0 | 2.0 | 2.0 |
| Evaluation of sintered body (target) | Reduction treatment | | No | No | No | No | No | No |
| | Crystal form | $Ga_{3-x}In_{5+x}Sn_2O_{16}$<br>Other than above | ①<br>② | ①<br>② | ①<br>② | ①<br>② | ①<br>② | ①<br>② |
| | Specific resistance (mΩcm) | | 4 | 4 | 4 | 400 | 300 | 450 |
| | Relative density (%) | | 99 | 99 | 99 | 89 | 90 | 88 |
| | Appearance (unevenness in color) | | A | A | A | B | B | B |
| Evaluation of thin film | Electron carrier density | $(cm^{-3})$ | $8 \times 10^{17}$ | $1 \times 10^{18}$ | $8 \times 10^{17}$ | $2 \times 10^{17}$ | $9 \times 10^{17}$ | $1 \times 10^{17}$ |
| | Wet etching rate | Organic acid (easiness in dissolution) | A | A | A | C | C | C |
| | Resistance to inorganic acid | Inorganic acid (difficulty in dissolution) | A | A | A | A | A | A |
| | Dry etching rate | (Easiness in being etched) | B | B | B | A | A | A |
| Evaluation of TFT | Mobility (cm²/Vs) | | 17 | 17 | 17 | 9 | 10 | 7 |
| | On-off ratio | | $10^9$ | $10^9$ | $10^9$ | $10^9$ | $10^9$ | $10^9$ |
| | Off current (pA) | | 0.5 | 0.5 | 0.5 | 0.5 | 0.5 | 0.5 |
| | Vth (V) | | −0.1 | −0.1 | −0.1 | 0.8 | 0.8 | 0.9 |

| | | | Examples | | | | |
|---|---|---|---|---|---|---|---|
| | | | 16 | 17 | 18 | 19 | 20 |
| Preparation of sintered body | Pre-firing | | No | Conducted | Conducted | Conducted | Conducted |
| | Mixing method | | Ball mill | Beads mill | Beads mill | Beads mill | Beads mill |

TABLE 2-continued

| | | | | | | | |
|---|---|---|---|---|---|---|---|
| | | Granulation method | Natural drying | Spray dryer | Spray dryer | Spray dryer | Spray dryer |
| | | Shaping method | CIP | CIP | CIP | CIP | CIP |
| | Sintering conditions | Sintering atmosphere | In the air | Oxygen inflow | Oxygen inflow | Oxygen inflow | Oxygen inflow |
| | | Sintering temperature (°C.) | 1400 | 1500 | 1500 | 1500 | 1350 |
| | | Sintering time (Hr) | 12 | 15 | 15 | 15 | 15 |
| | Composition ratio of sintered body (atomic ratio) | In/(In + Ga + Sn) | 0.25 | 0.40 | 0.40 | 0.44 | 0.40 |
| | | Ga/(In + Ga + Sn) | 0.25 | 0.50 | 0.55 | 0.55 | 0.50 |
| | | Sn/(In + Ga + Sn) | 0.50 | 0.10 | 0.05 | 0.01 | 0.10 |
| | | Zn/In + Ga + Sn + Zn) | 0.00 | 0.00 | 0.00 | 0.00 | 0.00 |
| | Grinding | Thickness before grinding (mm) | 9.0 | 10.0 | 10.0 | 10.0 | 10.0 |
| | | Thickness after grinding (mm) | 5.0 | 6.0 | 6.0 | 6.0 | 6.0 |
| | | Amount removed from upper and lower surfaces (mm, each) | 2.0 | 2.0 | 2.0 | 2.0 | 2.0 |
| | | Reduction treatment | No | No | No | No | No |
| Evalutaion of sintered body (target) | Crystal form | $Ga_{3-x}In_{5+x}Sn_2O_{16}$ | ① | ① | ① | ② | ① |
| | | Other than above | ② | ② | ② | ① | ② |
| | Specific resistance (mΩcm) | | 600 | 18 | 24 | 95 | 70 |
| | Relative density (%) | | 86 | 98 | 97 | 95 | 93 |
| | Appearance (unevenness in color) | | B | A | A | A | A |
| Evaluation of thin film | Electron carrier density | $(cm^{-3})$ | $9 \times 10^{16}$ | $4 \times 10^{17}$ | $3 \times 10^{17}$ | $3 \times 10^{17}$ | $4 \times 10^{17}$ |
| | Wet etching rate | Organic acid (easiness in dissolution) | C | A | A | A | A |
| | Resistance to inorganic acid | Inorganic acid (difficulty in dissolution) | A | A | A | B | A |
| | Dry etching rate | (Easiness in being etched) | A | B | B | B | B |
| Evalution of TFT | Mobility (cm²/Vs) | | 6 | 14 | 13 | 9 | 13 |
| | On-off ratio | | $10^8$ | $10^{10}$ | $10^{10}$ | $10^9$ | $10^{10}$ |
| | Off current (pA) | | 1.0 | 0.1 | 0.1 | 0.5 | 0.1 |
| | Vth(V) | | 1.5 | 0.4 | 0.7 | 2.1 | 0.4 |

\* For the crystal form, ① indicates the main component and ② indicates the secondary component.

TABLE 3

| | | | Com. Ex. | | | | |
|---|---|---|---|---|---|---|---|
| | | | 1 | 2 | 3 | 4 | 5 |
| Preparation of sintered body | Pre-firing | | No | No | No | No | No |
| | Mixing method | | Ball mill | Ball mill | Ball mill | Ball mill | Ball mill |
| | Granulation method | | Natural drying | Natural drying | Natural drying | Natural drying | Natural drying |
| | Shaping method | | CIP | CIP | CIP | CIP | CIP |
| | Sintering conditions | Sintering atmosphre | In the air | In the air | In the air | In the air | In the air |
| | | Sintering temperature (°C.) | 1400 | 1400 | 1400 | 1400 | 1400 |
| | | Sintering time(Hr) | 12 | 12 | 12 | 12 | 12 |
| | Composition ratio of sintered body (atomic ratio) | In/(In + Ga + Sn) | 0.50 | 0.00 | 0.50 | 0.00 | 0.00 |
| | | Ga/(In + Ga + Sn) | 0.50 | 0.50 | 0.00 | 0.00 | 0.00 |
| | | Sn/(In + Ga + Sn) | 0.00 | 0.50 | 0.50 | 1.00 | 0.00 |
| | | Zn/(In + Ga + Sn + Zn) | 0.00 | 0.00 | 0.00 | 0.00 | 1.00 |
| | Grinding | Thickness before grinding (mm) | 9.0 | 9.0 | 9.0 | 9.0 | 9.0 |
| | | Thickness after grinding (mm) | 5.0 | 5.0 | 5.0 | 5.0 | 5.0 |
| | | Amount removed from upper and lower surfaces (mm, each) | 2.0 | 2.0 | 2.0 | 2.0 | 2.0 |
| | | Reduction treatment | No | No | No | No | No |
| Evaluation of sintered body (target) | Crystal form | $Ga_{3-x}In_{5+x}Sn_2O_{16}$ | — | — | — | — | — |
| | | Other than above | ① | ① | ① | ① | ① |
| | Specific resistance (mΩcm) | | 900 | 8000 | 3000 | 7000 | 6000 |
| | Relative density (%) | | 84 | 72 | 82 | 76 | 78 |
| | Appearance (unevenness in color) | | C | C | C | C | C |
| Evaluation of thin film | Electron carrier density | $(cm^{-3})$ | $6 \times 10^{16}$ | $1 \times 10^{16}$ | $3 \times 10^{19}$ | $8 \times 10^{18}$ | $9 \times 10^{17}$ |
| | Wet etching rate | Organic acid (easiness in dissolution) | C | C | C | C | A |

TABLE 3-continued

| | | Com. Ex. | | | | |
|---|---|---|---|---|---|---|
| | | 1 | 2 | 3 | 4 | 5 |
| Evalution of TFT | Resistancee to inorganic acid | A | A | A | C | C |
| | Inorganic acid (difficulty in dissolution) | | | | | |
| | Dry etching rate | A | A | A | A | B |
| | (Easiness in being etched) | | | | | |
| | Mobility (cm$^2$/Vs) | 2 | <0.5 | — | 0.1 | 0.5 |
| | On-off ratio | 10$^4$ | 10$^2$ | <10 | 10 | 10$^3$ |
| | Off current (pA) | 100 | 10000 | 500000 | 100000 | 1000 |
| | Vth(V) | 4.7 | >5 | <−10 | 6.8 | −2.8 |

* For the crystal form, ① indicates the main component and ② indicates the secondary component.

TABLE 4

| | Example 1 | Example 6 | Example 7 | Example 8 |
|---|---|---|---|---|
| Peak ① | 31.06 | 30.96 | 30.88 | 31.14 |
| Peak ② | 36.04 | 35.96 | 35.84 | 36.18 |
| Peak ③ | 51.96 | 51.92 | 51.64 | 52.10 |
| Peak ④ | 61.80 | 61.60 | 61.46 | 61.96 |

Unit: Angle "°"
① 30.5~31.5°
② 35.5~36.5°
③ 51.5~52.5°
④ 61.0~62.5°

TABLE 5

| | Example 1 | Example 6 | Example 7 | Example 8 |
|---|---|---|---|---|
| Peak ① | 1.00 | 1.00 | 1.00 | 1.00 |
| Peak ② | 1.16 | 1.16 | 1.16 | 1.16 |
| Peak ③ | 1.67 | 1.68 | 1.67 | 1.67 |
| Peak ④ | 1.99 | 1.99 | 1.99 | 1.99 |

INDUSTRIAL APPLICABILITY

The oxide sintered body of the invention can be preferably used in a sputtering target or the like which is used when an oxide thin film is formed Although only some exemplary embodiments and/or examples of this invention have been described in detail above, those skilled in the art will readily appreciate that many modifications are possible in the exemplary embodiments and/or examples without materially departing from the novel teachings and advantages of this invention. Accordingly, all such modifications are intended to be included within the scope of this invention.

The documents described in the specification are incorporated herein by reference in its entirety.

The invention claimed is:

1. An oxide sintered body comprising indium element (In), gallium element (Ga) and tin element (Sn) in atomic ratios represented by the following formulas (1) to (3), wherein the content of zinc element (Zn) is 10000 ppm or less:

$$0.10 \leq In/(In+Ga+Sn) \leq 0.60 \quad (1)$$

$$0.30 < Ga/(In+Ga+Sn) \leq 0.55 \quad (2)$$

$$0.0001 < Sn/(In+Ga+Sn) \leq 0.30 \quad (3).$$

2. The oxide sintered body according to claim 1 wherein the atomic ratio of In, Ga and Sn satisfies the following formulas (4) and (5):

$$0.01 \leq Sn/(In+Ga+Sn) \leq 0.30 \quad (4)$$

$$0.30 < Ga/(In+Ga+Sn) \leq 0.55 \quad (5).$$

3. The oxide sintered body according to claim 1, wherein the atomic ratio of In, Ga and Sn satisfies the following formula (7):

$$0.10 \leq /(In+Ga+Sn) < 0.60 \quad (7).$$

4. The oxide sintered body according to claim 1, which comprises a compound having a crystal structure represented by $Ga_{3-x}In_{5+x}Sn_2O_{16}$ wherein X is 0 to 1.

5. A sputtering target using the oxide sintered body according to claim 1.

6. A method for producing the sputtering target according to claim 5 comprising the steps of:
(a) mixing raw material compound powder to prepare a mixture;
(b) shaping the mixture to prepare a shaped body having an average thickness of 5.5 mm or more;
(c) sintering the shaped body at 1280° C. or more and 1520° C. or less for 2 hours or longer and 96 hours or shorter;
(d) grinding the surface of the sintered body obtained in step (c) by 0.3 mm or more; and
(e) bonding the sintered body to a backing plate.

7. The oxide sintered body according to claim 1, wherein the atomic ratio of In, Ga and Sn satisfies the following formula:

$$Sn/(In+Ga+Sn) \leq 0.20.$$

8. An oxide semiconductor film comprising indium element (In), gallium element (Ga) and tin element (Sn) in an atomic ratio represented by the following formulas (1) to (3) and having an electron carrier density of $10^{14}$ cm$^{-3}$ or more and $10^{19}$ cm$^{-3}$ or less, wherein the content of zinc element (Zn) is 10000 ppm or less:

$$0.10 \leq In/(In+Ga+Sn) 0.60 \quad (1)$$

$$0.30 < Ga/(In+Ga+Sn) \leq 0.55 \quad (2)$$

$$0.0001 < Sn/(In+Ga+Sn) \leq 0 \; 0.30 \quad (3).$$

9. A semiconductor device using the oxide semiconductor film according to claim 8.

10. The oxide semiconductor film according to claim 8 wherein the, atomic ratio of In, Ga and Sn satisfies the following formula:

$$Sn/(In+Ga+Sn) \leq 0.20.$$

* * * * *

UNITED STATES PATENT AND TRADEMARK OFFICE
CERTIFICATE OF CORRECTION

PATENT NO.         : 8,999,208 B2                                    Page 1 of 1
APPLICATION NO.    : 13/580355
DATED              : April 7, 2015
INVENTOR(S)        : Masayuki Itose et al.

It is certified that error appears in the above-identified patent and that said Letters Patent is hereby corrected as shown below:

In the claims

Column 24, claim 8, line 52, Formula 1:

"$0.10 \leq In/(In+Ga+Sn) 0.60$" should read as -- $0.10 \leq In/(In+Ga+Sn) \leq 0.60$ (1) --

Column 24, claim 8, line 56, Formula 3:

"$0.0001 < Sn/(1n+Ga+Sn) \leq 0\ 0.30$" should read as -- $0.0001 < Sn/(1n+Ga+Sn) \leq 0.30$ (3) --

Signed and Sealed this
Twenty-seventh Day of October, 2015

Michelle K. Lee
*Director of the United States Patent and Trademark Office*